(12) United States Patent
Beak et al.

(10) Patent No.: US 10,937,738 B2
(45) Date of Patent: Mar. 2, 2021

(54) SEMICONDUCTOR PACKAGE AND METHOD OF MANUFACTURING THE SAME

(71) Applicant: Samsung Electronics Co., Ltd., Suwon-si (KR)

(72) Inventors: O-hyun Beak, Seoul (KR); Keon Kuk, Yongin-si (KR); Young-chul Ko, Suwon-si (KR); Woon-bae Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 347 days.

(21) Appl. No.: 14/991,800

(22) Filed: Jan. 8, 2016

(65) Prior Publication Data

US 2016/0204073 A1 Jul. 14, 2016

(30) Foreign Application Priority Data

Jan. 9, 2015 (KR) .................. 10-2015-0003469
Jun. 22, 2015 (KR) .................. 10-2015-0088717

(51) Int. Cl.
*H01L 23/552* (2006.01)
*H04W 4/50* (2018.01)
(Continued)

(52) U.S. Cl.
CPC ............ *H01L 23/552* (2013.01); *B05C 5/001* (2013.01); *B05C 5/027* (2013.01); *H01L 21/02255* (2013.01); *H01L 21/32051* (2013.01); *H01L 21/67115* (2013.01); *H01L 23/291* (2013.01); *H01L 23/293* (2013.01); *H01L 23/295* (2013.01); *H01L 23/481* (2013.01); *H01L 24/49* (2013.01); *H04W 4/50* (2018.02);
(Continued)

(58) Field of Classification Search
CPC ...................................... H01L 23/552
See application file for complete search history.

(56) References Cited

U.S. PATENT DOCUMENTS 5,600,181 A 2/1997 Scott et al.
6,507,492 B2 1/2003 Morris et al.
(Continued)

FOREIGN PATENT DOCUMENTS

CN 1802883 A 7/2006
CN 1943111 A 4/2007
(Continued)

OTHER PUBLICATIONS

US 6,487,090 B2, 11/2002, Kopf et al. (withdrawn)
(Continued)

*Primary Examiner* — Errol V Fernandes
(74) *Attorney, Agent, or Firm* — Nixon & Vanderhye P.C.

(57) ABSTRACT

A semiconductor package includes a semiconductor chip mounted on a substrate, an insulating layer covering at least a portion of the semiconductor chip and including a thixotropic material or a hot melt material, and a shielding layer covering at least a portion of the semiconductor chip and the insulating layer. A method of manufacturing the semiconductor package includes forming an insulating layer and a shielding layer having a high aspect ratio by using a three-dimensional printer.

24 Claims, 23 Drawing Sheets

(51) Int. Cl.

| | | |
|---|---|---|
| H01L 23/29 | (2006.01) | |
| B05C 5/00 | (2006.01) | |
| B05C 5/02 | (2006.01) | |
| H01L 21/02 | (2006.01) | |
| H01L 21/3205 | (2006.01) | |
| H01L 21/67 | (2006.01) | |
| H01L 23/48 | (2006.01) | |
| H01L 23/00 | (2006.01) | |
| H05K 1/18 | (2006.01) | |
| H01L 23/31 | (2006.01) | |
| H01L 25/10 | (2006.01) | |
| H01L 21/56 | (2006.01) | |
| H01L 25/065 | (2006.01) | |

(52) U.S. Cl.
CPC .............. *H05K 1/181* (2013.01); *H01L 21/56* (2013.01); *H01L 23/3135* (2013.01); *H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 25/0655* (2013.01); *H01L 25/0657* (2013.01); *H01L 25/105* (2013.01); *H01L 2224/04042* (2013.01); *H01L 2224/16145* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/81815* (2013.01); *H01L 2224/92125* (2013.01); *H01L 2225/0651* (2013.01); *H01L 2225/06506* (2013.01); *H01L 2225/06513* (2013.01); *H01L 2225/06517* (2013.01); *H01L 2225/06537* (2013.01); *H01L 2225/06541* (2013.01); *H01L 2225/1023* (2013.01); *H01L 2225/1058* (2013.01); *H01L 2924/00014* (2013.01); *H01L 2924/14* (2013.01); *H01L 2924/1432* (2013.01); *H01L 2924/1433* (2013.01); *H01L 2924/1434* (2013.01); *H01L 2924/1436* (2013.01); *H01L 2924/1437* (2013.01); *H01L 2924/14511* (2013.01); *H01L 2924/15311* (2013.01); *H01L 2924/15331* (2013.01)

(56) References Cited

U.S. PATENT DOCUMENTS

| | | | |
|---|---|---|---|
| 6,508,671 B2 | 1/2003 | Ko | |
| 6,537,084 B2 | 3/2003 | Casey et al. | |
| 6,541,698 B2 | 4/2003 | Miska | |
| 6,567,276 B2 | 5/2003 | Kopf et al. | |
| 6,570,761 B2 | 5/2003 | Stone et al. | |
| 6,576,832 B2 | 6/2003 | Svarfvar et al. | |
| 6,618,270 B2 | 9/2003 | Babin et al. | |
| 6,624,353 B2 | 9/2003 | Gabower | |
| 6,637,719 B2 | 10/2003 | Jiang | |
| 6,652,777 B2 | 11/2003 | Rapp et al. | |
| 6,654,256 B2 | 11/2003 | Gough | |
| 6,671,186 B2 | 12/2003 | Kopf | |
| 6,717,799 B2 | 4/2004 | Hamano et al. | |
| 6,734,045 B2 | 5/2004 | Morris | |
| 6,743,975 B2 | 6/2004 | Kolb | |
| 6,825,726 B2 | 11/2004 | French et al. | |
| 6,833,031 B2 | 12/2004 | Arnold | |
| 6,854,174 B2 | 2/2005 | Jiang | |
| 6,865,804 B2 | 3/2005 | Youker et al. | |
| 6,879,495 B2 | 4/2005 | Jiang | |
| 6,900,383 B2 | 5/2005 | Babb et al. | |
| 6,924,244 B2 | 8/2005 | Takagi et al. | |
| 7,047,054 B2 | 5/2006 | Benni | |
| 7,292,459 B2 | 11/2007 | Wang | |
| 7,474,175 B2 | 1/2009 | Furihata et al. | |
| 7,633,015 B2 | 12/2009 | Wurzel et al. | |
| 8,022,673 B2 | 9/2011 | Nishiyama et al. | |
| 8,119,191 B2 | 2/2012 | Bunyan et al. | |
| 8,212,340 B2 | 7/2012 | Liao | |
| 8,653,633 B2 | 2/2014 | Liao et al. | |
| 8,766,416 B2 | 7/2014 | Hsu et al. | |
| 9,072,204 B2 | 6/2015 | Kuwabara et al. | |
| 9,929,131 B2 * | 3/2018 | Yoo | H01L 21/565 |
| 2001/0022230 A1 | 9/2001 | Kaplo | |
| 2001/0033478 A1 | 10/2001 | Ortiz et al. | |
| 2002/0046849 A1 | 4/2002 | Rapp et al. | |
| 2002/0050373 A1 | 5/2002 | Kaplo | |
| 2002/0129951 A1 * | 9/2002 | Babb | H01L 23/552 |
| | | | 174/358 |
| 2002/0129971 A1 | 9/2002 | Kolb et al. | |
| 2002/0131259 A1 | 9/2002 | Rozy et al. | |
| 2004/0262749 A1 | 12/2004 | Matayabas, Jr. et al. | |
| 2006/0272150 A1 | 12/2006 | Eguchi et al. | |
| 2006/0272857 A1 | 12/2006 | Arnold | |
| 2007/0071886 A1 | 3/2007 | Babb et al. | |
| 2008/0123316 A1 | 5/2008 | Chen et al. | |
| 2011/0006408 A1 * | 1/2011 | Liao | H01L 21/561 |
| | | | 257/660 |
| 2012/0120613 A1 | 5/2012 | Kuwabara et al. | |
| 2012/0228749 A1 * | 9/2012 | Pagaila | H01L 23/147 |
| | | | 257/659 |
| 2013/0082364 A1 * | 4/2013 | Wang | H01L 23/3128 |
| | | | 257/659 |
| 2013/0120903 A1 | 5/2013 | Pan et al. | |
| 2013/0214396 A1 * | 8/2013 | Kim | H01L 23/552 |
| | | | 257/659 |
| 2014/0140001 A1 | 5/2014 | Gerken et al. | |

FOREIGN PATENT DOCUMENTS

| | | |
|---|---|---|
| CN | 101958254 A | 1/2011 |
| CN | 102474987 A | 5/2012 |
| CN | 103327741 A | 9/2013 |
| CN | 203437643 U | 2/2014 |
| JP | 2002-334954 | 11/2002 |
| JP | 2008-258478 | 10/2008 |
| TW | 201338108 A | 9/2013 |
| TW | 201426949 A | 7/2014 |

OTHER PUBLICATIONS

Int'l Search Report and Written Opinion for PCT/KR2016/000014 dated Apr. 18, 2016.
Extended European Search Report for 16735133.7 dated Dec. 8, 2017.
Chinese Office Action dated Nov. 1, 2018 for CN Application No. 201680005436.7.
TW Office Action dated May 6, 2019 for TW Application No. 105100334.
IN Office Action dated May 22, 2019 for IN Application No. 201727025294.
CN Office Action dated May 29, 2019 for CN Application No. 201680005436.7.
Chinese Office Action dated Dec. 20, 2019 for CN Application No. 201680005436.7.

\* cited by examiner

SEMICONDUCTOR PACKAGE AND METHOD OF MANUFACTURING THE SAME

RELATED APPLICATION(S)

This application claims the benefit of Korean Patent Application No. 10-2015-0003469, filed on Jan. 9, 2015, and Korean Patent Application No. 10-2015-0088717, filed on Jun. 22, 2015 in the Korean Intellectual Property Office, the disclosure of which is incorporated herein in its entirety by reference.

BACKGROUND

The present disclosure relates to a semiconductor package and a method of manufacturing the same, and more particularly, to a semiconductor package including an electromagnetic waves shielding member for protecting a semiconductor chip in the semiconductor package from external factors and shielding electromagnetic waves, and a method of manufacturing the same.

As the market for electronic products expands, demand for more functionality and smaller portable devices have rapidly increased, and, thus, technology has led to miniaturization and weight reduction of electronic components in the electronic products. In this regard, not only are sizes of the various electronic components reduced, but several discrete semiconductor chips may be put in one semiconductor package. In particular, a semiconductor packages capable of processing high frequency signals should not only be miniaturized but also include various electromagnetic waves shielding structures to alleviate electromagnetic interference or electromagnetic susceptibility.

SUMMARY

Provided is a semiconductor package including an electromagnetic wave shielding structure that allows miniaturization and weight reduction of the semiconductor package and also has excellent shielding properties with respect to electromagnetic interference.

Additional aspects will be set forth in part in the description that follows and, in part, will be apparent from the description or may be learned by practice of the presented exemplary embodiments.

According to an aspect of an exemplary embodiment, a semiconductor package includes a semiconductor chip mounted on a substrate, and a shielding layer covering at least a portion of the semiconductor chip, where a thickness of a side surface portion of the shielding layer is less than a height of the side surface portion of the shielding layer.

The semiconductor package may include a multi-chip package.

The thickness of the side surface portion of the shielding layer may be less than one fifth of a height of the shielding layer.

An upper surface of the shielding layer forms an angle of substantially 90° with a side surface of the shielding layer.

The shielding layer may include an edge where an upper surface of the shielding layer and a side surface of the shielding layer contact each other, the edge having a predetermined radius of curvature, and the predetermined radius of curvature may be less than a sum of a thickness of the upper surface of the shielding layer and a thickness of the side surface of the shielding layer.

The semiconductor package may further include, between the semiconductor chip and the shielding layer, an insulating layer including a thixotropic material or a hot melt material.

The thixotropic material may include at least one of composite fine silica, bentonite, fine particles of surface treated calcium carbonate, hydrogenated castor oil, metal soap, aluminum stearate, polyamide wax, oxidized polyethylene, and linseed polymerized oil.

The hot melt material may include at least one of polyurethane, polyurea, polyvinyl chloride, polystyrene, acrylonitrile butadiene styrene, polyamide, acrylic, and polybutylene terephthalate.

The thixotropic material or the hot melt material may be cured by ultraviolet curing or heat curing.

The shielding layer may be a metallic material.

At least one of the shielding layer and the insulating layer may be formed by three-dimensional printing.

The semiconductor package may include an application processor for use in a mobile phone.

According to an aspect of another exemplary embodiment, a semiconductor package includes a semiconductor chip mounted on a substrate, an insulating layer covering at least a portion of the semiconductor chip and where the insulating layer may be a thixotropic material or a hot melt material, and a shielding layer covering the semiconductor chip and the insulating layer.

The thixotropic material may include at least one of composite fine silica, bentonite, fine particles of surface treated calcium carbonate, hydrogenated castor oil, metal soap, aluminum stearate, polyamide wax, oxidized polyethylene, and linseed polymerized oil.

The hot melt material may include at least one of polyurethane, polyurea, polyvinyl chloride, polystyrene, acrylonitrile butadiene styrene, polyamide, acrylic, and polybutylene terephthalate.

The thixotropic material or the hot melt material may be cured by ultraviolet curing or heat curing.

The shielding layer may include a metallic material.

A sum of a thickness of the insulating layer and a thickness of the shielding layer may be less than a height of the insulating layer.

A sum of a thickness of the insulating layer and a thickness of the shielding layer may be less than one fifth of a height of the insulating layer.

The semiconductor package may include at least one of an application processor, a display driver integrated circuit, a timing controller, and a power module integrated circuit.

At least one of the insulating layer and the shielding layer may be formed by three-dimensional printing.

At least one of the insulating layer and the shielding layer may be formed by a material supply device comprising an opening having same shape as a side surface shape of a corresponding one of the insulating layer and the shielding layer.

The insulating layer covers at least a portion of the semiconductor chip.

The semiconductor chip may include a first semiconductor chip and a second semiconductor chip, the first semiconductor chip and the second semiconductor chip may be aligned on the substrate, and the insulating layer may be interposed between the first semiconductor chip and the second semiconductor chip.

According to an aspect of another exemplary embodiment, a semiconductor package includes a package substrate connected to a printed circuit board via a connection terminal, a plurality of semiconductor chips stacked on the package substrate in a multi-layer structure, an insulating layer covering at least a portion of the plurality of semiconductor chips, and comprising a thixotropic material or a hot melt material, and a shielding layer covering at least a portion of the plurality of semiconductor chips and the insulating layer, wherein a thickness of a side surface portion of the shielding layer is less than a height of the shielding layer.

Each of the plurality of semiconductor chips may include a through-electrode, and each of the plurality of semiconductor chips is connected to at least another of the plurality of semiconductor chips via the through-electrode.

The semiconductor package may further include wires connecting the plurality of semiconductor chips to the package substrate, wherein the wires are configured to transmit electric signals between the plurality of semiconductor chips and the package substrate.

The thickness of the side surface portion of the shielding layer may be less than one fifth of the height of the shielding layer.

The thixotropic material may include at least one of composite fine silica, bentonite, fine particles of surface treated calcium carbonate, hydrogenated castor oil, metal soap, aluminum stearate, polyamide wax, oxidized polyethylene, and linseed polymerized oil.

The hot melt material may include at least one of polyurethane, polyurea, polyvinyl chloride, polystyrene, acrylonitrile butadiene styrene, polyamide, acrylic, and polybutylene terephthalate.

At least one of the insulating layer and the shielding layer is formed by a material supply device comprising an opening having same shape as a side surface shape of a corresponding one of the insulating layer and the shielding layer.

According to an aspect of another exemplary embodiment, a semiconductor package includes a printed circuit board, a first semiconductor package formed on the printed circuit board and including a first package substrate connected to the printed circuit board via a first connection terminal and a first semiconductor chip mounted on the first package substrate, a second semiconductor package formed on the first package substrate and including a second package substrate connected to the first package substrate via a second connection terminal and a plurality of second semiconductor chips stacked on the second package substrate as a multi-layer structure, an insulating layer covering at least a portion of a side surface of the first semiconductor package and a side surface of the second semiconductor package and comprising a thixotropic material or a hot melt material; and a shielding layer covering at least a portion of the side surface of the first semiconductor package and an upper surface and the side surface of the second semiconductor package, wherein a thickness of a side surface portion of the shielding layer is less than a height of the shielding layer.

The semiconductor package may further include wires connecting the plurality of second semiconductor chips to the second package substrate, wherein the wires are configured to transmit electric signals between the plurality of second semiconductor chips and the second package substrate.

According to an aspect of another exemplary embodiment, a method of manufacturing a semiconductor package includes, mounting a semiconductor chip on a substrate, forming an insulating layer covering at least a portion of the semiconductor chip, the insulating layer comprising a thixotropic material or a hot melt material, and forming a shielding layer covering at least a portion of the semiconductor chip and the insulating layer.

The thixotropic material may include at least one of composite fine silica, bentonite, fine particles of surface treated calcium carbonate, hydrogenated castor oil, metal soap, aluminum stearate, polyamide wax, oxidized polyethylene, and linseed polymerized oil.

The hot melt material may include at least one of polyurethane, polyurea, polyvinyl chloride, polystyrene, acrylonitrile butadiene styrene, polyamide, acrylic, and polybutylene terephthalate.

The thixotropic material or the hot melt material may be cured by ultraviolet curing or heat curing.

The shielding layer may include a metallic material.

A sum of a thickness of the insulating layer and a thickness of the shielding layer may be less than a height of the insulating layer.

A sum of a thickness of the insulating layer and a thickness of the shielding layer may be less than one fifth of a height of the insulating layer.

At least one of the insulating layer or the shielding layer may be formed by a material supply device comprising an opening having same shape as a side surface shape of a corresponding one of the insulating layer and the shielding layer.

At least one of the shielding layer and the insulating layer may be formed by three-dimensional printing.

According to an aspect of another exemplary embodiment, a mobile phone includes a communication module configured to receive installation data of an application from a server, a memory module configured to store the received installation data of the application, and an application processors configured to install the application on the mobile phone based on the installation data of the application and to execute the installed application on the mobile phone, wherein at least one of the application processor and the memory module includes a semiconductor package including a semiconductor chip mounted on a substrate, and a shielding layer covering the semiconductor chip, wherein a thickness of a side surface portion of the shielding layer is less than a height of the side surface portion of the shielding layer.

The thickness of the side surface portion of the shielding layer may be less than one fifth of the height of the side surface portion of the shielding layer.

The mobile phone may further include an insulating layer including a thixotropic material or a hot melt material, between the semiconductor chip and the shielding layer.

According to an aspect of another exemplary embodiment, a three-dimensional printer includes a chip transportation unit configured to transport a substrate and a semiconductor chip mounted on the substrate in a first direction, a dispensing head unit configured to form a shielding layer and an insulating layer by injecting a shielding material and an insulating material on to an upper surface and a side surface of the semiconductor chip, respectively, via a dispensing process, and a head transportation unit configured to transport the dispensing head unit in the first direction, a second direction perpendicular to the first direction, and a third direction perpendicular to each of the first direction and the second direction. Each of the shielding material and the insulating material includes a thixotropic material or a hot melt material, and a sum of a thickness of a side surface portion of the shielding layer and a thickness of a side surface portion of the insulating layer is less than a height of the side surface portion of the shielding layer.

The dispensing head unit may include a first injection pump configured to hold the shielding material having a thixotropic or a hot melt property, and a first nozzle configured to form the shielding layer by injecting the shielding material on to the upper surface of the semiconductor chip and coating the upper surface of the semiconductor chip with the shielding material.

The dispensing head unit may include a second injection pump configured to hold the insulating material having a thixotropic or a hot melt property, and a second nozzle configured to form the insulating layer by injecting the insulating material on to the side surface of the semiconductor chip.

The three-dimensional printer may further include a light source configured to cure the shielding material and the insulating material by heat curing or ultraviolet curing.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
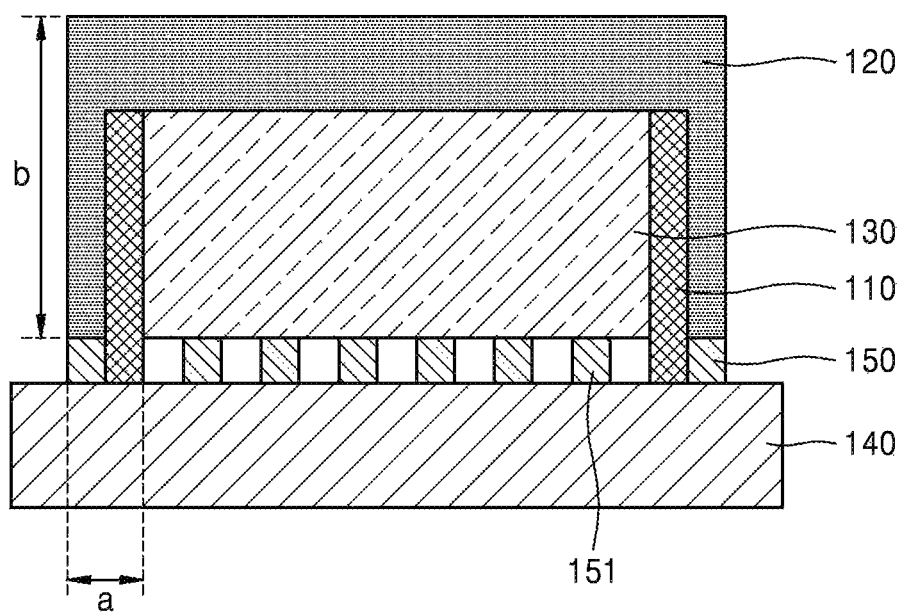
FIG. 1 is a cross-sectional view of a semiconductor package according to an exemplary embodiment.

Various embodiments of the disclosure will now be described more fully with reference to the accompanying drawings, in which elements of the various embodiments are shown. The present disclosure may be embodied in many different forms and should not be construed as being limited to the exemplary embodiments set forth herein. Rather, these embodiments are provided so that this disclosure will be thorough and complete, and will fully convey the scope of the disclosure to one of ordinary skill in the art. Like reference numerals refer to like elements throughout. In the drawings, the thicknesses of layers and regions and the sizes of components may be exaggerated for clarity. It should also be understood that detailed drawings showing every detail may not be feasible. Accordingly, when an element is shown, it should be understood that it may be an approximation or an agglomeration. For example, if a contact pad is shown, that contact pad may represent numerous separate contact pads.

It will be understood that when an element, such as a layer, a region, or a substrate, is referred to as being "on," "connected to" or "coupled to" another element, it may be directly on, connected to, or coupled to the other element or intervening elements may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," etc.).

It will be understood that, although the terms first, second, third, etc. may be used to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments.

As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Unless otherwise defined in this disclosure, all terms (including technical and scientific terms) used herein have the same meaning as commonly understood by one of ordinary skill in the art to which exemplary embodiments belong.

Hereinafter, exemplary embodiments of the present disclosure will be described in detail.

FIG. 1 is a cross-sectional view of a semiconductor package 100 according to an exemplary embodiment. Referring to FIG. 1, the semiconductor package 100 is bonded via contact pads 150 and 151 to an upper surface of a package substrate 140. The contact pad 150 may be formed to ground a semiconductor chip 130, and the contact pad 151 may be formed to ground the semiconductor chip 130 or to transmit a signal. Contact pads may also be referred to as connection terminals.

In the semiconductor package 100, the semiconductor chip 130 and an insulating layer 110 may be disposed on the package substrate 140, and the insulating layer 110 may be disposed to be adjacent to the inner side surfaces of a shielding layer 120 and the contact pads 150. Accordingly, the shielding layer 120 may cover the semiconductor chip 130 and the insulating layer 110. The shielding layer 120 may also be connected to the contact pad 150, and the insulating layer 110 may be formed to separate the semiconductor chip 130 and the contact pad 150 from each other.

As used in this disclosure, "cover" does not necessarily mean just being over something. An object ABC covering an object XYZ may generally mean that the object ABC is adjacent to a surface of the object XYZ, regardless of whether ABC is separated from the object XYZ by space or not. Accordingly, ABC may be said to cover XYZ when ABC is under XYZ, next to XYZ, over XYZ, and any combination of ABC being around XYZ.

The semiconductor package 100 may have, for example, a through silicon via (TSV) structure, a multi-chip package (MCP) structure, or a package on package (PoP) structure. Also, the semiconductor package 100 may be included in an application processor, a display driver integrated circuit (IC), a timing controller, or a power module IC. Also, the semiconductor package 100 may be included in a smart phone, a display apparatus, or a wearable device.

If the semiconductor package 100 is mounted in an electronic device (for example, a cellular phone) including the package substrate 140, electromagnetic waves generated by electronic components in the semiconductor package 100 may cause electro-magnetic interference (EMI) with other electronic components mounted in the electronic device. Thus, errors may occur in the electronic device with the semiconductor package 100, and the reliability of the product may deteriorate.

The problems of such errors due to stray electromagnetic waves have become even more serious in the case of the semiconductor package 100 that may have several components operating at high speed. Therefore, the shielding layer 120 may reduce the amount of electromagnetic waves emitted during operation of the semiconductor package 100, as well as reduce interference to the semiconductor chip 130 from electromagnetic waves emitted by other semiconductor packages.

However, thickness of the insulating layer 110 or the shielding layer 120 may lead to inefficient degree of integration in a semiconductor package. A ratio of a semiconductor package's height to its area is called an aspect ratio. Referring to FIG. 1, the aspect ratio of the semiconductor package 100 may be obtained by dividing its height ('b'—height of the shielding layer 120) by a sum (distance 'a') of a thickness of a side surface portion of the insulating layer 110 and a thickness of a side surface portion of the shielding layer 120. The aspect ratio (r) may be represented by the following equation.

$$\text{Aspect ratio } (r) = b/a \qquad \text{[Equation 1]}$$

Accordingly, a low aspect ratio may be a sign of inefficient usage of vertical space for semiconductor chips and/or too inefficient use of horizontal space on the package substrate 140.

Therefore, various implementations may strive to increase the aspect ratio of the semiconductor package 100 so that the relative area occupied by the semiconductor package 100 on the package substrate 140 may decrease, thus increasing the degree of integration.

The shielding layer 120 may be formed on the semiconductor chip 130 as, for example, a rectangular shape. An upper surface of the shielding layer 120 may be formed to be 90° or substantially 90° with respect to a side surface of the shielding layer 120. However, shapes of the shielding layer 120 are not limited thereto.

According to an exemplary embodiment, the aspect ratio of the semiconductor package 100 may be equal to or greater than 1, and higher aspect ratios of 5 or more may be desirable. To realize this, the insulating layer 110 may be formed by using thixotropic material or hot melt material. The thixotropic material or the hot melt material may be injected as a fluid and then cured (or hardened) by ultraviolet (UV) light or heat. In this way. The thixotropic material or the hot melt material in the insulating layer 110 may comprise a metallic material to help shield against EMI.

Various embodiments of the disclosure may form the insulating layer 110 and/or the shielding layer 120 using three-dimensional (3D) printing. Thus, high expenses related to the manufacturing equipment and the time consumed for the manufacturing process may be reduced. Also, according to an exemplary embodiment, the insulating layer 110 or the shielding layer 120 may be formed by a material supply device including an opening having the same shape as the side surface of the insulating layer 110 or the shielding layer 120.

Figure 2A:
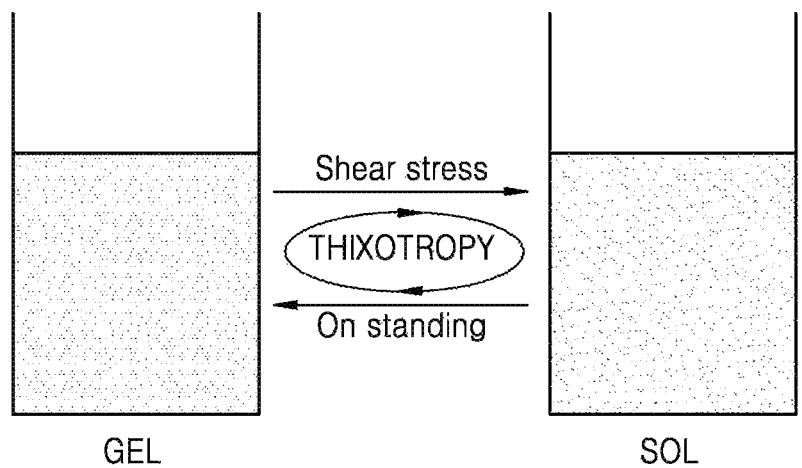
FIGS. 2A and 2B are views for describing states for a thixotropic material included in a semiconductor package according to an exemplary embodiment.
Figure 2B:
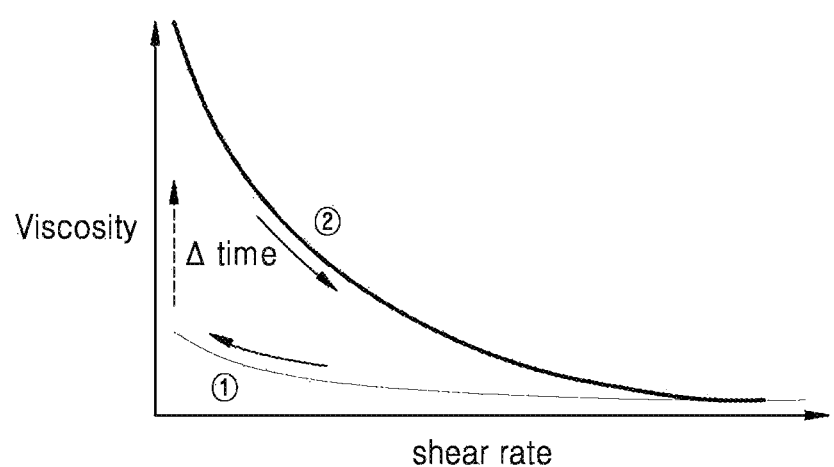

FIGS. 2A and 2B are views for describing a thixotropic material included in a semiconductor package according to an exemplary embodiment.

Referring to FIG. 2A, the thixotropic material is capable of a phase change, between a gel state and a sol state, due to shear stress. For example, if shear stress is applied to the thixotropic material in a gel state, the thixotropic material is changed to a sol state. For example, if time passes without applying shear stress to the thixotropic material, while the thixotropic material remains in the sol state, the thixotropic material is changed to the gel state again.

Referring to FIG. 2B, if shear stress is applied to the thixotropic material, a viscosity of the thixotropic material becomes low so that the thixotropic material becomes to be in a state which is easily changeable, and if the thixotropic material is left during a time lapse in a state in which the shear stress is dismissed, the thixotropic material becomes to have a high viscosity again and restores its original shape. That is, if the shear stress is applied to the thixotropic material, a net structure of the thixotropic material is destroyed so that the thixotropic material has a low viscosity, and if the shear stress is dismissed, the thixotropic material restores its net structure so as to have a high viscosity.

For example, referring to first curve (1), when shear stress is applied to the thixotropic material in a sol state, a change of viscosity is little. Referring to second curve (2), when shear stress is applied to the thixotropic material in a gel state, a change of viscosity is great. Also, according to a time lapse Δtime, the thixotropic material may be changed from a state of first curve (1) to a state of second curve (2). That is, the viscosity of the thixotropic material may be changed according to a time lapse Δtime and a strength of shear stress.

The thixotropic material may be realized by adding a thixotropic additive to a high viscosity material. For example, the thixotropic material may be realized by adding the materials mentioned in the description of FIG. 1 (for example, composite fine silica, bentonite, fine particles of surface treated calcium carbonate, hydrogenated castor oil, metal soap, aluminum stearate, polyamide wax, oxidized polyethylene, and linseed polymerized oil.

An insulating layer is formed by using a material having a low viscosity, to which shear stress is applied, and the insulating layer may be cured by UV curing or heat curing.

Figure 3:
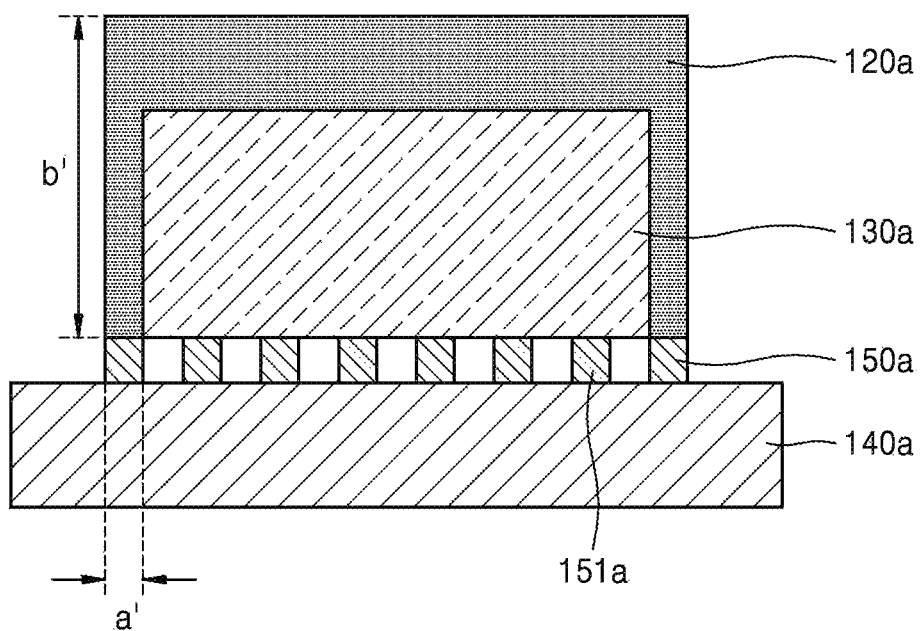
FIG. 3 is a cross-sectional view of a semiconductor package according to an exemplary embodiment.

FIG. 3 is a cross-sectional view of a semiconductor package 100a according to an exemplary embodiment. Referring to FIG. 3, the semiconductor package 100a may be mounted on an upper surface of the package substrate 140a via contact pads 150a and 151a. The semiconductor package 100a may comprise a shielding layer 120a covering the semiconductor chip 130a. The semiconductor package 100a may be similar to the semiconductor package 100 of FIG. 1. The aspect ratio for the semiconductor package 100a is shown as: r=b'/a'. Note that there is no insulating layer as in FIG. 1, so the aspect ratio may be bigger than for the semiconductor package of FIG. 1 if the height b' is the same as the height b.

According to an exemplary embodiment, the aspect ratio of the semiconductor package 100a may be equal to or greater than 1, and in various embodiments the aspect ratio of the semiconductor package 100a may be equal to or greater than 5. Accordingly, miniaturization of components may be possible, and so various products that use these components may be made smaller.

Figure 4:
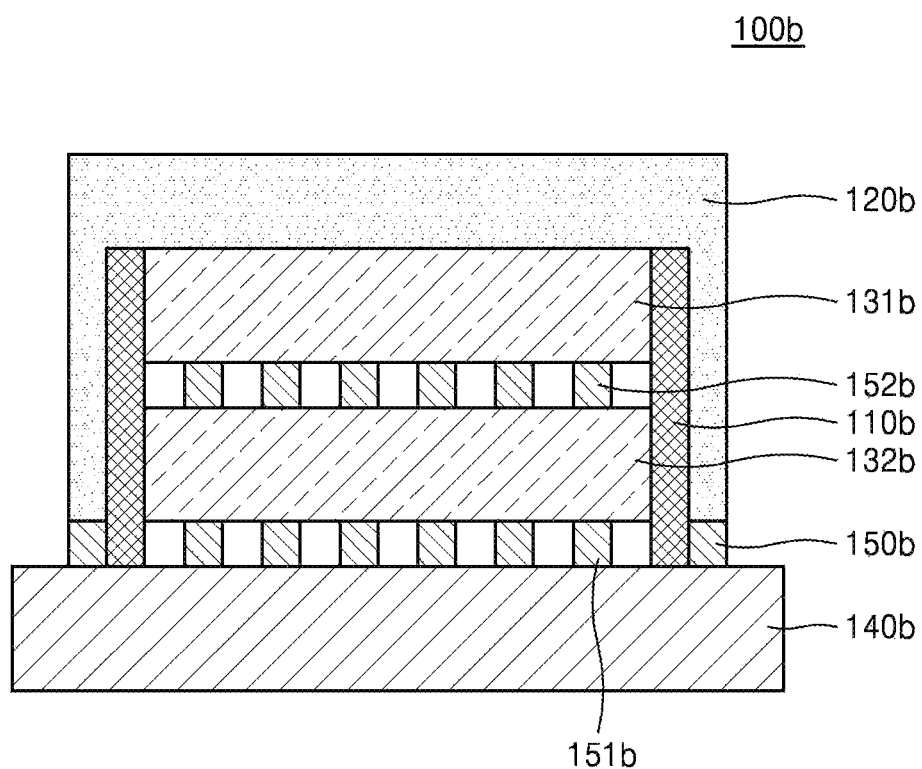
FIG. 4 is a cross-sectional view of a semiconductor package according to an exemplary embodiment.

FIG. 4 is a cross-sectional view of a semiconductor package 100b according to an exemplary embodiment. Referring to FIG. 4, the semiconductor package 100b may be realized as a PoP structure.

In the semiconductor package 100b, semiconductor chips 131b and 132b and an insulating layer 110b may be disposed on a package substrate 140b, and the insulating layer 110b may be disposed to be adjacent to the inner side surfaces of a shielding layer 120b and the contact pads 150b. Accordingly, the shielding layer 120b may cover the semiconductor chips 131b and 132b and the insulating layer 110b. The package substrate 140b and the semiconductor chip 132b may be connected to each other via contact pads 151b. The semiconductor chip 131b and the semiconductor chip 132b may be connected to each other via contact pads 152b.

According to an exemplary embodiment, the semiconductor chips 131b and 132b may be an application processor, a central processing unit (CPU), a controller, or an application specific integrated circuit (ASIC), which may be used in a mobile phone.

Each of the contact pads 151b and 152b may be used to transmit signals between the semiconductor chips 131b and 132b. Alternatively, any of the contact pads 151b and 152b may be used to ground the semiconductor chips 131b and 132b, respectively.

The insulating layer 110b and the shielding layer 120b of the semiconductor package 100b of the PoP structure may be realized by 3D printing, and thus, EMI shielding is possible on a chip level. Thus, a high aspect ratio of the semiconductor package 100b may be realized, which may contribute to a high integration of the semiconductor package 100b.

The insulating layer 110b may be formed by using a thixotropic material or a hot melt material, like the insulating layer 110 of FIG. 1. The thixotropic material or the hot melt material may be in a fluid state so that it may be easily injected via a dispenser, and then the thixotropic material or the hot melt material may be UV cured or heat cured to harden it. Also, the insulating layer 110b may be a metallic material. The insulating layer 110b may be formed of the metallic material in order to increase the EMI reduction effect.

Figure 5:
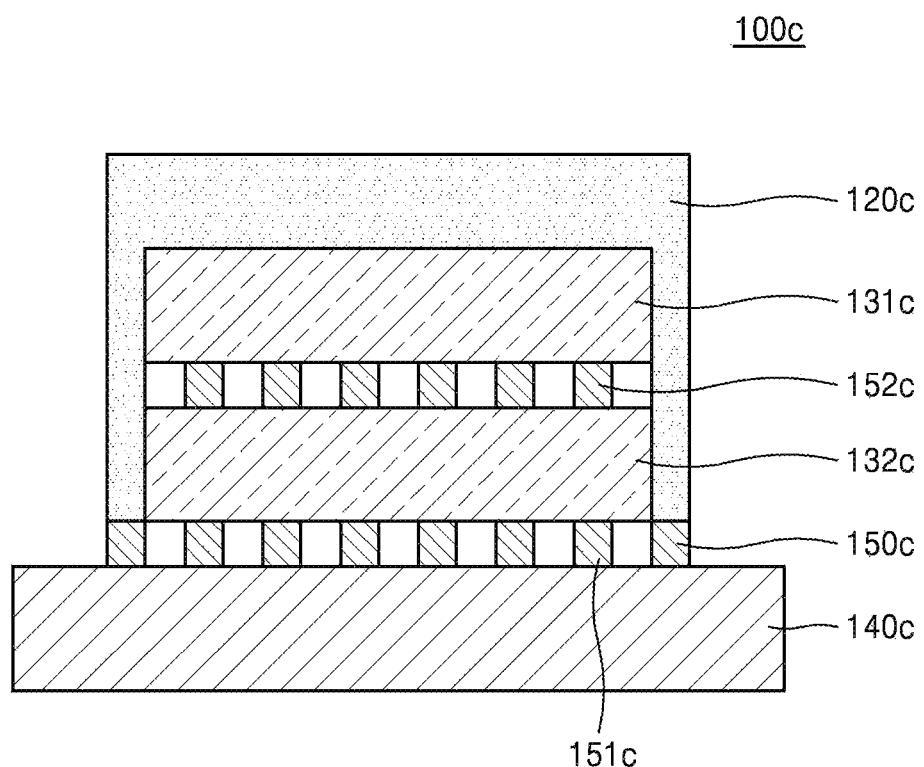
FIG. 5 is a cross-sectional view of a semiconductor package according to an exemplary embodiment.

FIG. 5 is a cross-sectional view of a semiconductor package 100c according to an exemplary embodiment. Referring to FIG. 5, the semiconductor package 100c may be realized as a PoP structure.

In the semiconductor package 100c, semiconductor chips 131c and 132c may be disposed on a package substrate 140c. The package substrate 140c and the semiconductor chip 132c may be connected to each other via contact pads 151c. The semiconductor chips 131c and 132c may be connected to each other via contact pads 152c. Also, a shielding layer 120c may cover the semiconductor chips 131c and 132c.

Each of the contact pads 151c and 152c may be used to transmit signals between the semiconductor chips 131c and 132c. Alternatively, any of the contact pads 151c and 152c may also be used to ground the semiconductor chips 131c and 132c, respectively.

The shielding layer 120c of the semiconductor package 100c of the PoP structure may be realized by 3D printing so that a high aspect ratio of the semiconductor package 100c can be realized. Thus, EMI shielding is possible on a chip level. The high aspect ratio may contribute to high integration.

Figure 6:
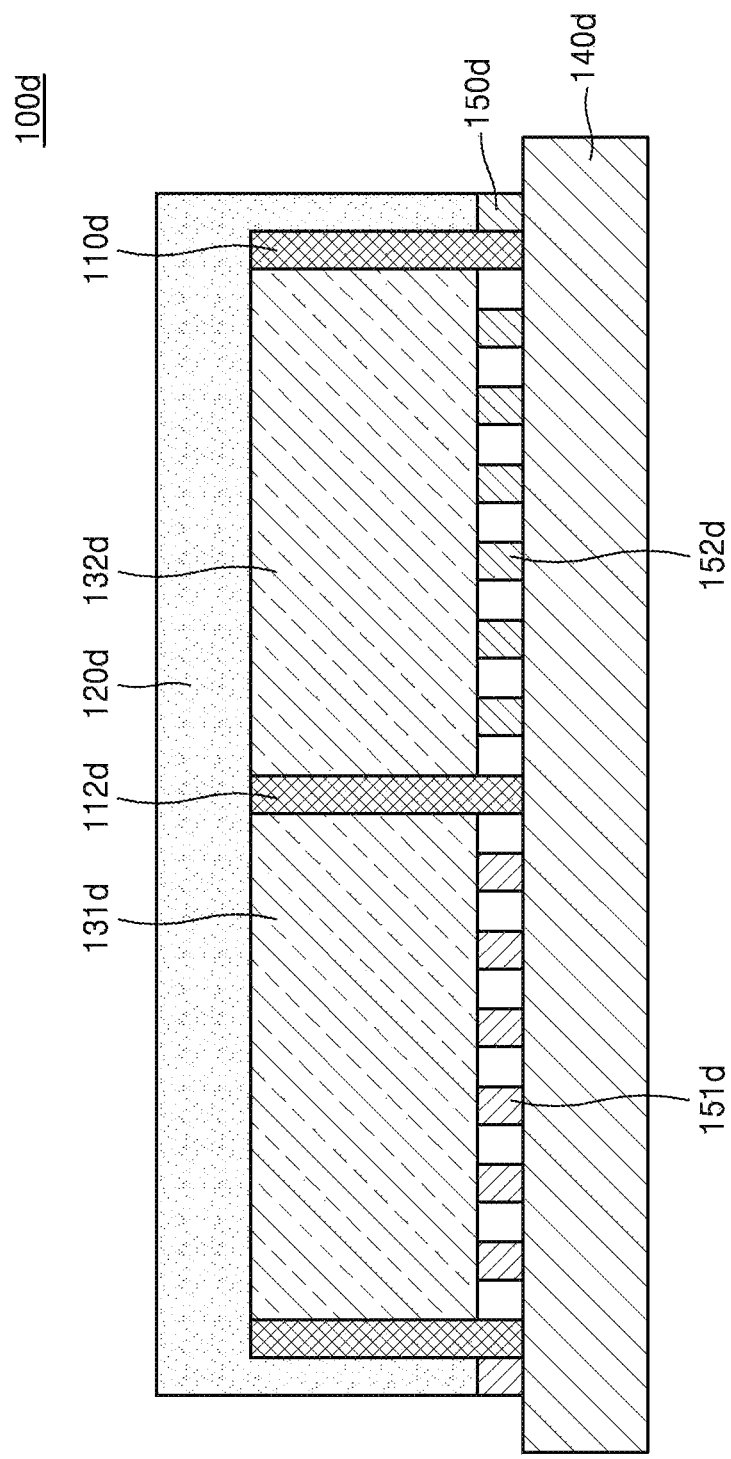
FIG. 6 is a cross-sectional view of a semiconductor package according to an exemplary embodiment.

FIG. 6 is a cross-sectional view of a semiconductor package 100d according to an exemplary embodiment. Referring to FIG. 6, the semiconductor package 100d may be realized as an MCP structure including the semiconductor chips 131d and 132d.

The semiconductor package 100d may include the semiconductor chip 131d and the semiconductor chip 132d disposed on a substrate 140d. The substrate 140d may be formed based on any one of, for example, a silicon substrate, a ceramic substrate, a printed circuit board (PCB), an organic substrate, and an interposer substrate. The semiconductor chip 131d and the semiconductor chip 132d may be the same type of semiconductor chips, or they may be different types of semiconductor chips. For example, each of the semiconductor chips 131d and 132d may be any one of an application processor, a CPU, a controller, and an ASIC that may be used, for example, in a mobile phone. The semiconductor chip 131d and the semiconductor chip 132d may be on the substrate 140d and may be connected to the substrate 140d via contact pads 151d and contact pads 152d, respectively. Also, a shielding layer 120d may cover the semiconductor chip 131d and the semiconductor chip 132d.

The contact pads 151d and 152d may be used to transmit an electrical signal to the semiconductor chip 131d and the semiconductor chip 132d, respectively. Contact pads 150d may be used to ground the semiconductor chip 131d and the semiconductor chip 132d.

An insulating layer 110d may be disposed on the substrate 140d and disposed to be adjacent to the inner side surfaces of the shielding layer 120d and the contact pads 150d. An insulating layer 112d may be disposed on the substrate 140d to be between the semiconductor chip 131d and the semiconductor chip 132d. The insulating layers 110d and 112d may be formed by using a thixotropic material or a hot melt material, and the thixotropic material or the hot melt material may be UV cured or heat cured.

According to an exemplary embodiment, the aspect ratio of the semiconductor package 100d may be equal to or greater than 1, and in various embodiments the aspect ratio of the semiconductor package 100d may be equal to or greater than 5. The shielding layer 120d of the semiconductor package 100d may be realized by 3D printing so a high aspect ratio of the semiconductor package 100d is realized. Thus, the EMI shielding is possible on a chip level. The high aspect ratio may contribute to high integration.

Figure 7:
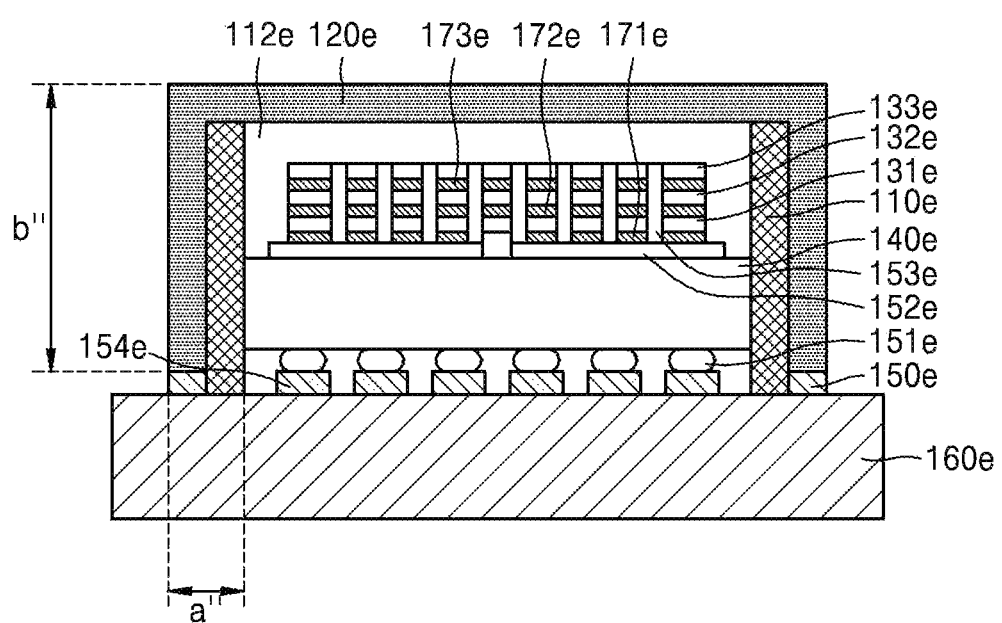
FIG. 7 is a cross-sectional view of a semiconductor package according to an exemplary embodiment.

FIG. 7 is a cross-sectional view of a semiconductor package 100e according to an exemplary embodiment. Referring to FIG. 7, the semiconductor package 100e may be realized as an MCP structure including a plurality of semiconductor chips 131e, 132e, and 133e stacked in a multi-layer structure.

The semiconductor package 100e may include an insulating layer 110e, a shielding layer 120e, the plurality of semiconductor chips 131e, 132e, and 133e, a package substrate 140e, contact pads 151e, and a PCB 160e. The plurality of semiconductor chips 131e, 132e, and 133e may be stacked on the package substrate 140e, and the package substrate 140e may be connected to the PCB 160e via the contact pads 151e. Accordingly, the semiconductor package 100e may be formed as a multi-layer structure. The plurality of semiconductor chips may include the semiconductor chip 131e, the semiconductor chip 132e, and the semiconductor chip 133e. However, the number of semiconductor chips in a stack need not be limited to three, but may be any number suitable for a design or implementation purpose.

According to an exemplary embodiment, the semiconductor chips 131e, 132e, and 133e may be the same type of semiconductor chips. For example, the semiconductor chips 131e, 132e, and 133e may be application processors used in a mobile phone. Each of the semiconductor chips 131e, 132e, and 133e may include through electrodes 153e for exchanging electrical signals with one another.

A first interlayer insulating layer 171e may be interposed between the package substrate 140e and the semiconductor chip 131e. A second interlayer insulating layer 172e may be interposed between the semiconductor chip 131e and the semiconductor chip 132e, and a third interlayer insulating layer 173e may be interposed between the semiconductor chip 132e and the semiconductor chip 133e. Contact pads 152e may be disposed between the package substrate 140e and the semiconductor chips 131e, 132e, and 133e, in order to electrically connect the package substrate 140e and the semiconductor chips 131e, 132e, and 133e.

Contact pads 150e may be used to ground the semiconductor chips 131e, 132e, and 133e. The contact pads 151e may be used to electrically connect the PCB 160e and the package substrate 140e. The contact pads 151e may be formed, for example, by a ball grid array (BGA) method, such as a solder ball. Contact pads 154e may be formed between the package substrate 140e and the contact pads 151e, and may be used to electrically connect between the PCB 160e and the package substrate 140e.

The insulating layer 110e may be disposed on the PCB 160e and adjacent to the inner side surfaces of the shielding layer 120e and the contact pads 150e. The insulating layer 110e may be formed by using a thixotropic material or a hot melt material, like the insulating layer 110 of FIG. 1. Also, the thixotropic material or the hot melt material may be UV cured or heat cured.

The shielding layer 120e may be formed to cover an upper surface of the semiconductor chip 133e disposed on the uppermost level from among the semiconductor chips 131e, 132e, and 133e, and a side surface of the insulating layer 110e. A molding unit 112e may be formed between the semiconductor chips 131e, 132e, and 133e and the insulating layer 110e, and between the semiconductor chips 131e, 132e, and 133e and the shielding layer 120e. The molding unit 112e may be formed by using an epoxy-based material, a thermosetting material, a thermoplastic material, a UV-processed material, etc. In FIG. 7, an aspect ratio may be the height (b″) of the shielding layer 120e divided by the thicknesses (a″) of side surface portions of the insulating layer 110e and the shielding layer 120e. When the aspect ratio of the semiconductor package 100e is high, an area occupied by the semiconductor package 100e on the PCB 160e may decrease, and this decrease may increase a degree of integration of the semiconductor package 100e. According to an exemplary embodiment, the aspect ratio of the semiconductor package 100e may be equal to or greater than 1, and in various embodiments the aspect ratio of the semiconductor package 100e may be equal to or greater than 5.

The shielding layer 120e of the semiconductor package 100e of the MCP structure may be realized by 3D printing, and thus, a high aspect ratio of the semiconductor package 100e may be realized. Thus, the EMI shielding is possible on a chip level. The high aspect ratio may contribute to high integration.

While the semiconductor chips 131e, 132e, and 133e may have been described with through electrodes 153e next to the chips, the various embodiments need not be so limited. Various well known methods may be used to interconnect the semiconductor chips 131e, 132e, and 133e to each other as well as to the contact pads 151e. For example, there may be connections from one chip to another through the insulating layers separating the chips.

Figure 8:
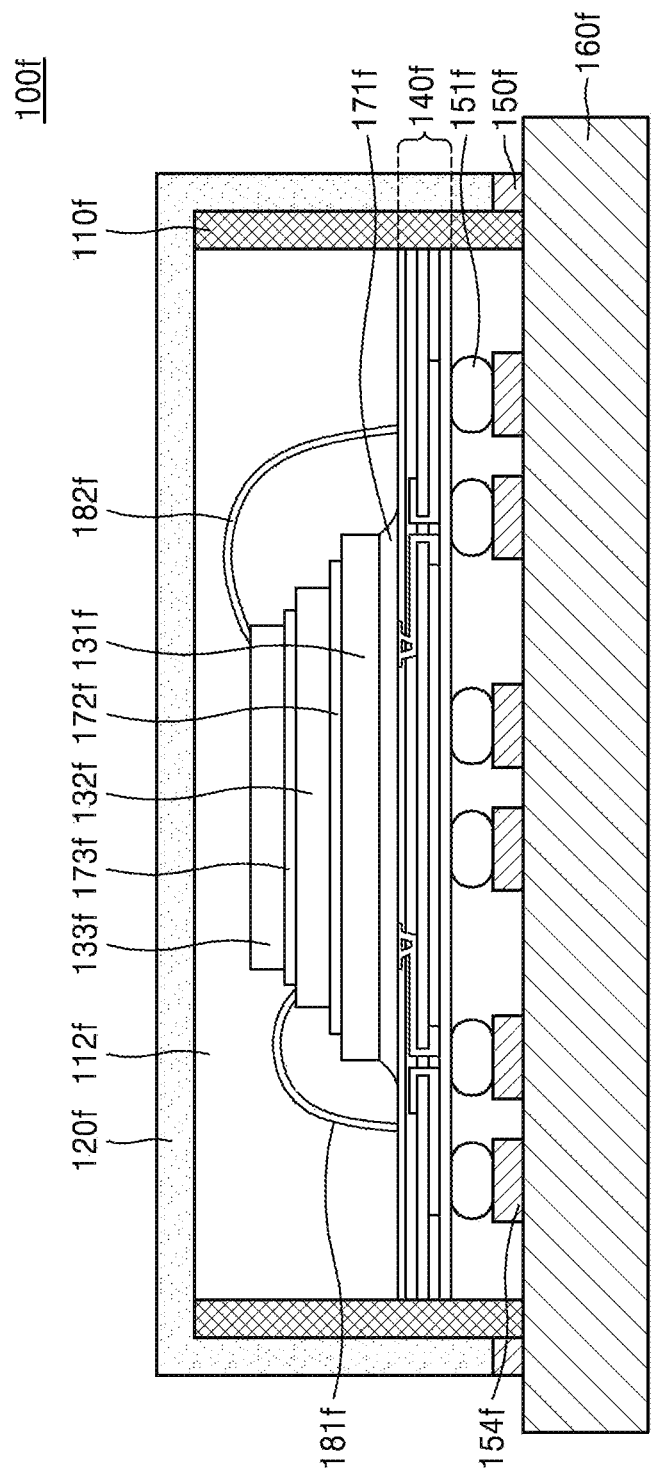
FIG. 8 is a cross-sectional view of a semiconductor package according to an exemplary embodiment.

FIG. 8 is a cross-sectional view of a semiconductor package 100f according to an exemplary embodiment.

Referring to FIG. 8, the semiconductor package 100f may be realized as an MCP structure including the semiconductor chips 131f, 132f, and 133f, which are stacked in a multi-layer structure. A first interlayer insulating layer 171f may be interposed between the package substrate 140f and the semiconductor chip 131f. A second interlayer insulating layer 172f may be interposed between the semiconductor chip 131f and the semiconductor chip 132f, and a third interlayer insulating layer 173f may be interposed between the semiconductor chip 132f and the semiconductor chip 133f.

The semiconductor chip 132f may be electrically connected to and may exchange signals with the package substrate 140f via the wire 181f. Likewise, the semiconductor chip 133f may be electrically connected to and may exchange signals with the package substrate 140f via the wire 182f. The plan areas of the semiconductor chips 131f, 132f, and 133f may be different from one another. The plan area of the semiconductor chip 131f may be greater than the plan area of the semiconductor chip 132f, and the plan area of the semiconductor chip 132f may be greater than the plan area of the semiconductor chip 133f. However, the plan areas of the semiconductor chips 131f, 132f, and 133f are not limited thereto.

The semiconductor package 100f may be similar to the semiconductor package 100e, and hence many components that are similar will not be described in detail. The semiconductor package 100f may include an insulating layer 110f, a shielding layer 120f, the semiconductor chips 131f, 132f, and 133f, a package substrate 140f, contact pads 150f, 151f, 154f, and a PCB 160f that are similar to corresponding parts of the semiconductor package 100e.

A molding unit 112*f* similar to the molding unit 112*e* may fill the inner space where the semiconductor chips 131*f*, 132*f*, and 133*f* are disposed between the shielding layer 120*f* and the package substrate 140*f*. The molding unit 112*f* may be formed by using an epoxy-based material, a thermosetting material, a thermoplastic material, a UV-processed material, etc.

The semiconductor package 100*f* of FIG. 8 differs from the semiconductor package 100*e* of FIG. 7 in that plan areas of the semiconductor chips 131*f*, 132*f*, and 133*f* are different from one another, and the semiconductor chips 132*f* and 133*f* are electrically connected to the package substrate 140*f* via wires 181*f* and 182*f*, respectively.

Aside from the wires 181*f* and 182*f*, the semiconductor chips 131*f*, 132*f*, and 133*f* may communicate with each other and to the package substrate 140*f* via various well known methods. For example, there may be connections from one chip to another or to the package substrate 140*f* through the insulating layers separating them.

Figure 9:
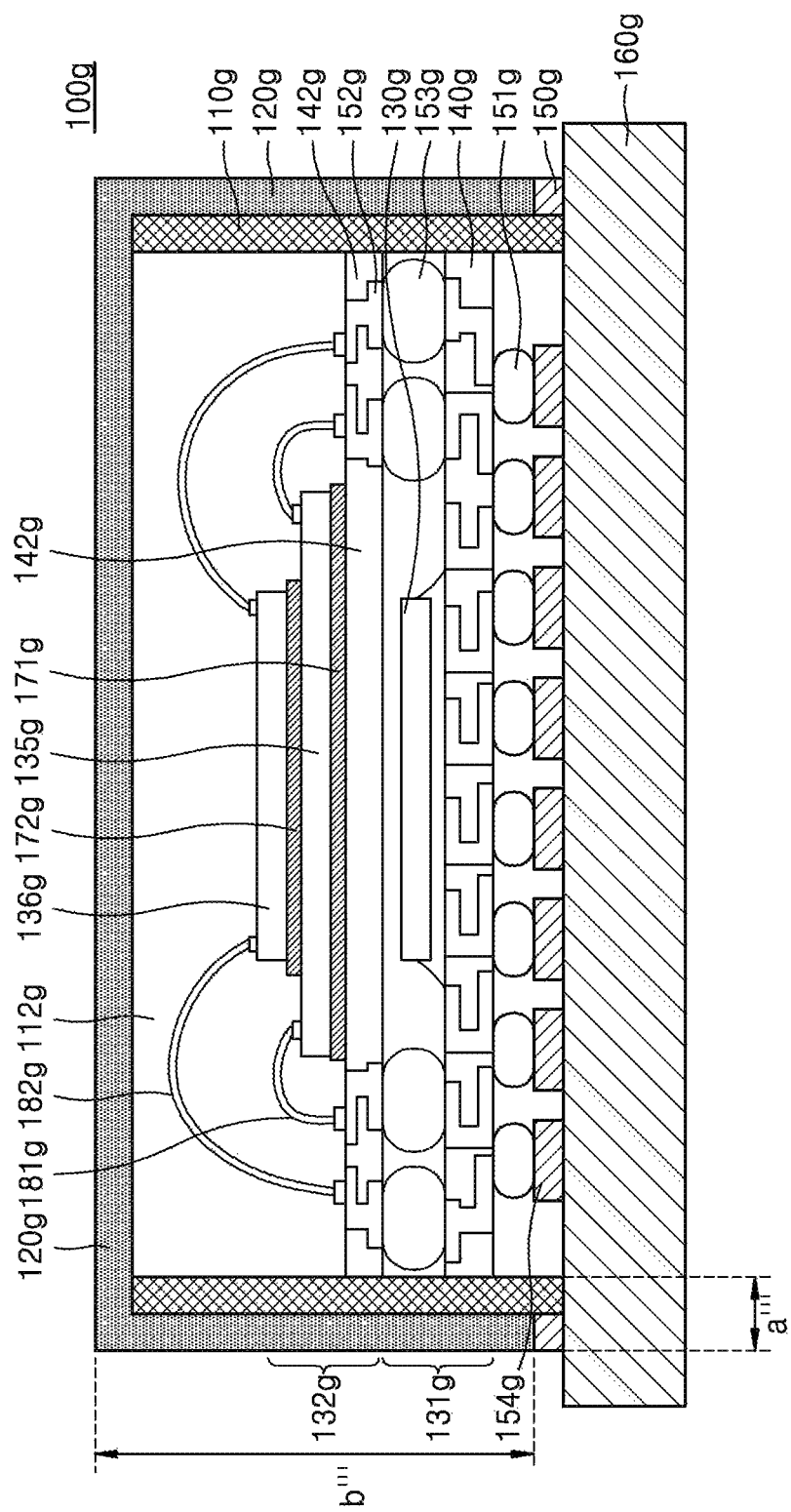
FIG. 9 is a cross-sectional view of a semiconductor package according to an exemplary embodiment.

FIG. 9 is a cross-sectional view of a semiconductor package 100*g* according to an exemplary embodiment. Referring to FIG. 9, the semiconductor package 100*g* may be realized as a PoP structure.

The semiconductor package 100*g* may include a PCB 160*g*, a first semiconductor package 131*g* formed on the PCB 160*g*, and a second semiconductor package 132*g* formed on the first semiconductor package 131*g*.

The first semiconductor package 131*g* may include a first package substrate 140*g*, and a semiconductor chip 130*g* mounted on the first package substrate 140*g*. The first package substrate 140*g* may be electrically connected to the PCB 160*g* via contact pads 151*g* and 154*g*. The semiconductor chip 130*g* may be a microprocessor such as, for example, a CPU, a controller, or an ASIC. According to an exemplary embodiment, the semiconductor chip 130*g* may be an application processor used in a mobile phone or a smartphone. The semiconductor chip 130*g* may exchange electrical signals with the PCB 160*g* and other devices connected to the PCB 160*g*, via the contact pads 151*g*.

The second semiconductor package 132*g* may include a second package substrate 142*g*, semiconductor chips 135*g* and 136*g* mounted on the second package substrate 142*g*, contact pads 152*g* and 153*g*, and wires 181*g* and 182*g*. Although it is illustrated with two semiconductor chips 135*g* and 136*g*, it is not limited thereto. Three or more semiconductor chips may be stacked as a multi-layer structure. The semiconductor chips 135*g* and 136*g* may be the same type of semiconductor chips. The semiconductor chips 135*g* and 136*g* may be, for example, at least one of dynamic random-access memory (DRAM), static random-access memory (SRAM), flash memory, electrically erasable programmable read-only memory (EEPROM), parameter random-access memory (PRAM), magnetoresistive random-access memory (MRAM), and resistive random-access memory (RRAM).

A first interlayer insulating layer 171*g* may be interposed between the semiconductor chip 135*g* and the second package substrate 142*g*, and a second interlayer insulating layer 172*g* may be interposed between the semiconductor chip 135*g* and the semiconductor chip 136*g*. The semiconductor chips 135*g* and 136*g* may be electrically connected to the second package substrate 142*g* via the wire 181*g* and the wire 182*g*, respectively.

Contact pads 153*g* may be used to electrically connect between the first package substrate 140*g* and the second package substrate 142*g*. The contact pads 153*g* may be formed as a ball grid array.

A ground unit 150*g* may be used to ground the semiconductor chip 130*g* and the semiconductor chips 135*g* and 136*g*.

An insulating layer 110*g* may be formed adjacent to the first semiconductor package 131*g* and the second semiconductor package 132*g*. In detail, the insulating layer 110*g* may be formed adjacent to the semiconductor chip 130*g* and the semiconductor chips 135*g* and 136*g*, by being adjacent to a side surface of the first package substrate 140*g* and a side surface of the second package substrate 142*g*. The insulating layer 110*g* may be formed by using a thixotropic material or a hot melt material. Also, the thixotropic material or the hot melt material may be UV cured or heat cured.

A shielding layer 120*g* may be formed to cover an upper surface of the semiconductor chip 136*g* and outside surface of the insulating layer 110*g*. A molding unit 112*g* may be formed between the semiconductor chips 130*g*, 135*g*, and 136*g* and the insulating layer 110*g*, and between the semiconductor chips 130*g*, 135*g*, and 136*g* and the shielding layer 120*g*. The molding unit 112*g* may be formed by using an epoxy-based material, a thermosetting material, a thermoplastic material, a UV-processed material, etc. According to the exemplary embodiment illustrated in FIG. 9, an aspect ratio may be defined as a value obtained by dividing a height (b''') of the shielding layer 120*g* by a sum of thicknesses (a''') of side surface portions of the insulating layer 110*g* and the shielding layer 120*g*. When the aspect ratio of the semiconductor package 100*g* is high, a relative area occupied by the semiconductor package 100*g* on the PCB 160*g* may decrease, and thus, a degree of integration of the semiconductor package 100*g* may increase.

The shielding layer 120*g* of the semiconductor package 100*g* of the PoP structure may be realized by 3D printing, and thus, the high aspect ratio of the semiconductor package 100*g* may be realized.

Figure 10:
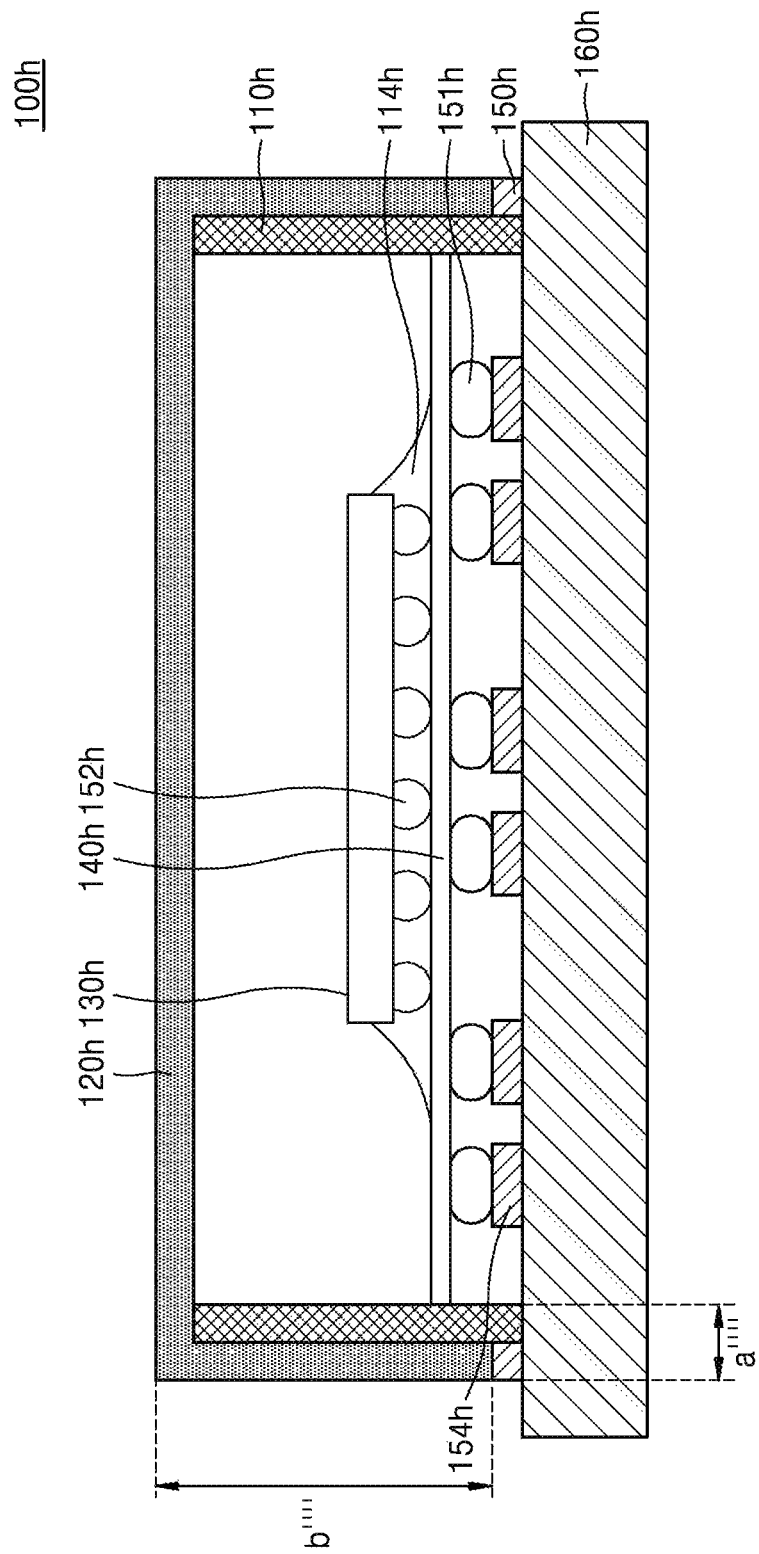
FIG. 10 is a cross-sectional view of a semiconductor package according to an exemplary embodiment.

FIG. 10 is a cross-sectional view of a semiconductor package 100*h* according to an exemplary embodiment.

Referring to FIG. 10, the semiconductor package 100*h* may be realized as a semiconductor package structure in which a semiconductor chip 130*h* is mounted on a package substrate 140*h* as a flip-chip structure. The semiconductor package 100*h* may include an insulating layer 110*h*, a shielding layer 120*h*, the semiconductor chip 130*h*, the package substrate 140*h*, a contact pads 150*h*, and a PCB 160*h*. The semiconductor package 100*h* illustrated in FIG. 10 differs from the semiconductor package 100*e* illustrated in FIG. 7 in that one semiconductor chip 130*h* is mounted in the flip chip structure. Components of the semiconductor package 100*h* have the same reference numerals as the components of the semiconductor package 100*e*, with only different English letters attached to the reference numerals, wherein like reference numerals refer to like elements. Thus, their descriptions will be omitted. The components of the semiconductor package 100*h* which are the same as the components of FIG. 7 will not be described in detail.

The semiconductor chip 130*h* may be mounted on the package substrate 140*h* as the flip-chip structure. The semiconductor chip 130*h* may be electrically connected to the package substrate 140*h* via contact pads 152*h*. The package substrate 140*h* may be electrically connected to the PCB 160*h* via contact pads 151*h*. The semiconductor chip 130*h* may exchange electrical signals with other devices connected to the PCB 160*h* via the contact pads 151*h* and 152*h*. Contact pads 154*h* may be disposed between the contact pads 151*h* and the PCB 160*h*, and may be used to electrically connect between the PCB 160*h* and the semiconductor chip 130*h* via the contact pad 151*h*.

An under-fill member 114h may be formed between a lower surface of the semiconductor chip 130h and an upper surface of the package substrate 140h and between the connection pads 152h.

The insulating layer 110h may be formed of the same material as the insulating layer 110e illustrated in FIG. 7. The shielding layer 120h may be formed as substantially the same structure as the shielding layer 120e illustrated in FIG. 7. According to the present exemplary embodiment illustrated in FIG. 10, an aspect ratio may be defined as a value obtained by dividing a height (b'''') of the shielding layer 120h by a sum of thicknesses (a'''') of side surface portions of the insulating layer 110h and the shielding layer 120h. When the aspect ratio of the semiconductor package 100h is high, a relative area occupied by the semiconductor package 100h on the PCB 160h may decrease, and thus, a degree of integration of the semiconductor package 100h may increase.

FIGS. 11A through 11E are views for describing a manufacturing process of a semiconductor package 1000, according to an exemplary embodiment.

Figure 11A:
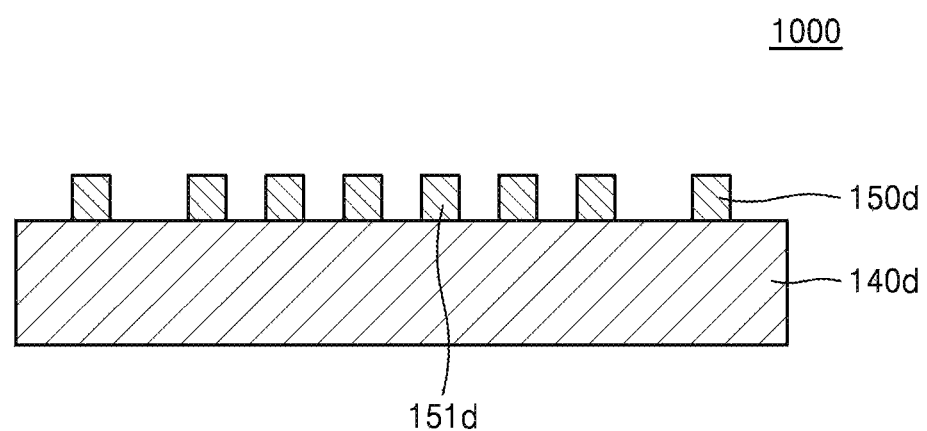
FIGS. 11A through 11E are views for describing a process of manufacturing a semiconductor package, according to an exemplary embodiment.

Referring to FIG. 11A, contact pads 150d and 151d may be patterned on a substrate 140d. The substrate 140d may have the contact pads 150d and 151d on an upper surface thereof. For example, the contact pads 150d may be for ground, and the contact pads 151d may be for signal or ground. The substrate 140d may be, for example, a double-sided PCB or a multi-layer PCB.

Figure 11B:
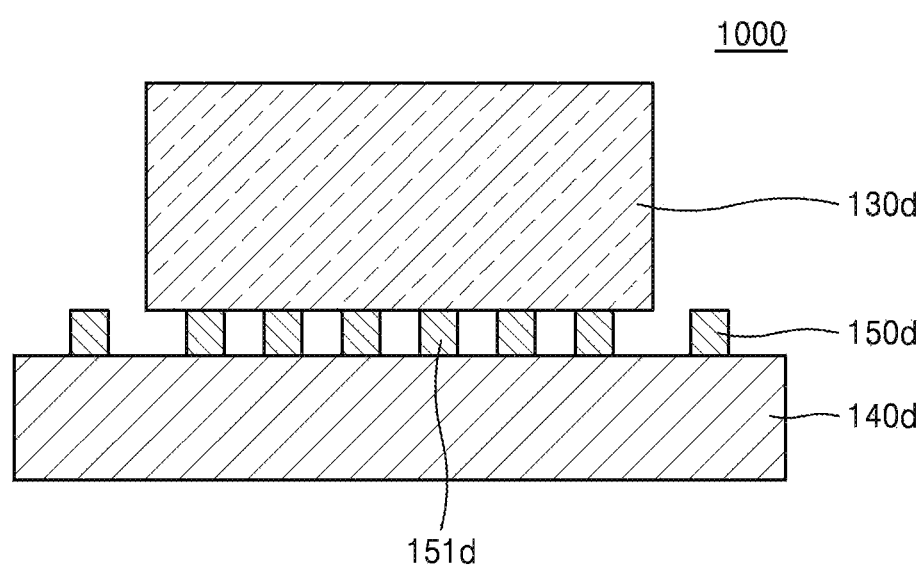

Referring to FIG. 11B, a semiconductor chip 130d may be disposed on the substrate 140d. Recently, demand for more functionality and smaller portable devices have rapidly increased, and, thus, technology has led to miniaturization and weight reduction of electronic components in the electronic products.

For this purpose, there is needed not only technology for reducing the sizes of the separate components, but also a system on chip (SOC) technology is needed to integrate a plurality of separate components into one chip, or a system in package (SIP) technology is needed for integrating a plurality of separate devices into one package.

In the SIP technology that integrates the plurality of separate devices into one package, the number of semiconductor chips may vary according to the purpose of a semiconductor package. The present disclosure does not limit the number of semiconductor chips in a package to a single number. The number of semiconductor chips may depend on various design and implementation criteria.

Figure 11C:
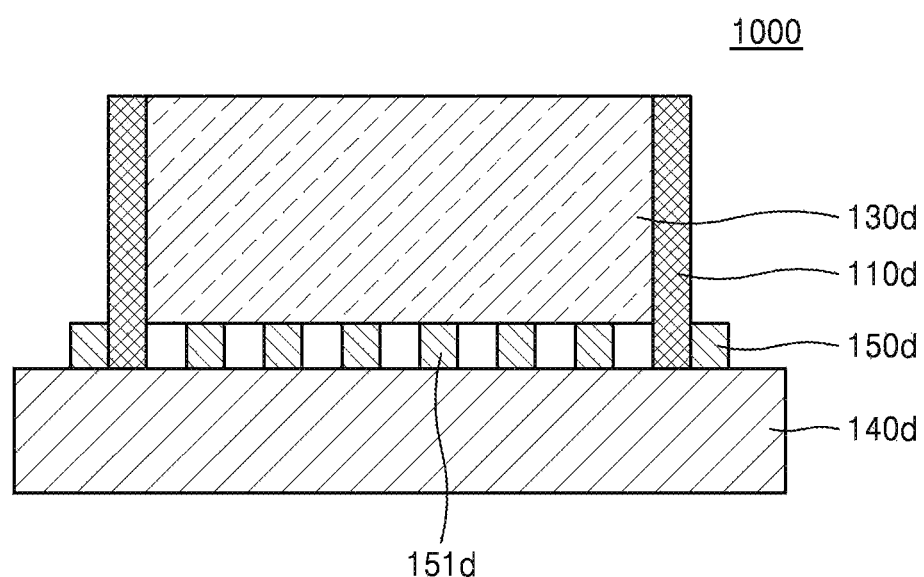

Referring to FIG. 11C, the insulating layer 110d may be formed, where the insulating layer 110d may be a thixotropic material or a hot melt material. The thixotropic material may include at least one of, for example, composite fine silica, bentonite, fine particles of surface treated calcium carbonate, hydrogenated castor oil, metal soap, aluminum stearate, polyamide wax, oxidized polyethylene, and linseed polymerized oil.

The hot melt material of the insulating layer 110d may include at least one of, for example, polyurethane, polyurea, polyvinyl chloride, polystyrene, acrylonitrile butadiene styrene (ABS), polyamide, acrylic, and polybutylene terephthalate (PBTP).

Figure 11D:
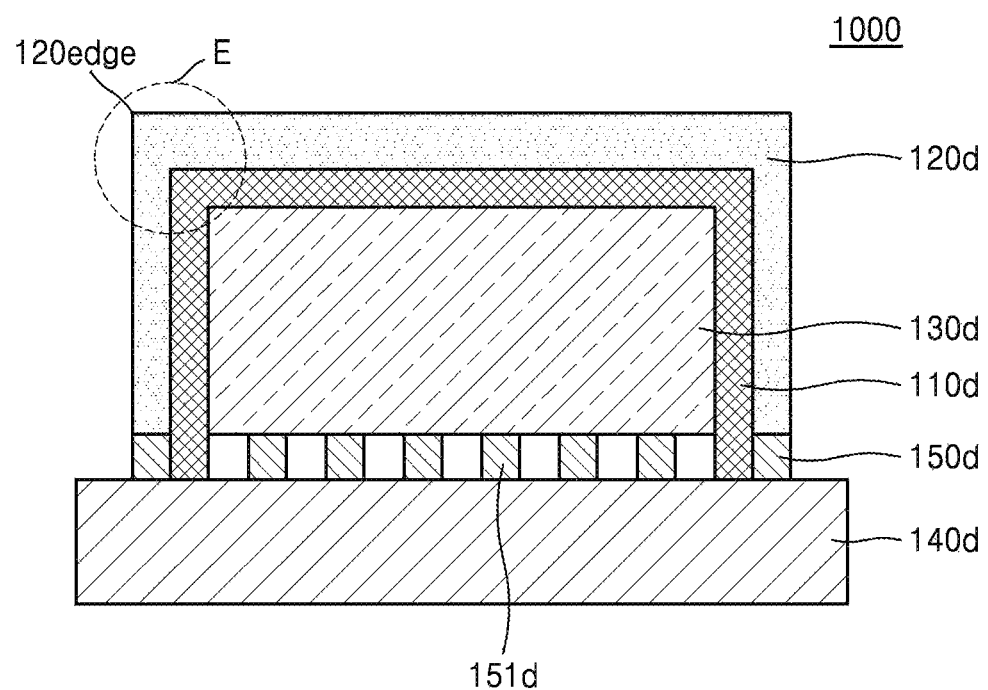

Referring to FIG. 11D, the shielding layer 120d may be formed to cover the semiconductor chip 130d. The insulating layer 110d may be interposed between the shielding layer 120d and the semiconductor chip 130d. An edge 120edge of the shielding layer 120d, at which an upper surface and a side surface of the shielding layer 120d meet each other, may be at 90° or substantially 90°. However, various embodiments of the disclosure need not be limited so. According to an exemplary embodiment, the edge 120edge of the shielding layer 120d may have a predetermined radius of curvature.

By forming the shielding layer 120d by using a high index thixotropic material, the shielding layer 120d may be formed by 3D printing, and thus, the edge 120edge of the shielding layer 120d may have a predetermined radius of curvature. A product including any one of the previously described semiconductor packages (100, and 100a through 100h) according to the exemplary embodiments illustrated in FIG. 1 and FIGS. 3 through 10 may be miniaturized and highly integrated. This aspect will be described later with reference to FIGS. 12 through 16.

As illustrated in FIG. 11D, the insulating layer 110d may also be formed on the upper surface of the semiconductor chip 130d. Also, according to another exemplary embodiment, the insulating layer 110d may be formed only on the side surface of the semiconductor chip 130d.

The shielding layer 120 may be formed to reduce EMI due to electromagnetic waves generated by the semiconductor chip 130, and also to reduce EMI on the semiconductor chip 130 by electromagnetic waves generated externally to the semiconductor package 1000.

According to an exemplary embodiment, the insulating layer 110d or the shielding layer 120d may be formed of thixotropic material or hot melt material so that a high aspect ratio is realized by 3D printing illustrated in FIGS. 12 through 16.

Figure 11E:
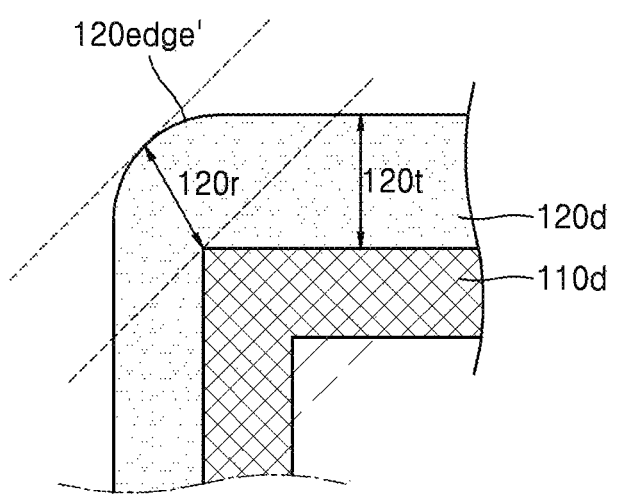

FIG. 11E is an enlarged view of the edge portion 120edge of FIG. 11D. Referring to FIG. 11E, an edge 120edge' located at a boundary portion of the shielding layer 120d, at which an upper surface and a side surface of the shielding layer 120d meet each other, may have a radius of curvature 120r, and may have a curvature corresponding to a reciprocal value of the radius of curvature 120r. The radius of curvature 120r may be less than or equal to a thickness 120t of the shielding layer 120d. That is, a maximum value of the radius of curvature 120r may be the same as or less than the thickness 120t of the shielding layer 120d.

According to an exemplary embodiment, the shielding layer 120d is formed by a process in which a high thixotropic material is discharged via a nozzle of a dispenser. Thus, as illustrated in FIG. 11E, the edge 120edge' of the shielding layer 120d may have the predetermined radius of curvature 120r. The method of forming the shielding layer 120d by 3D printing will be described in more detail with reference to FIGS. 12 through 16.

Figure 12:
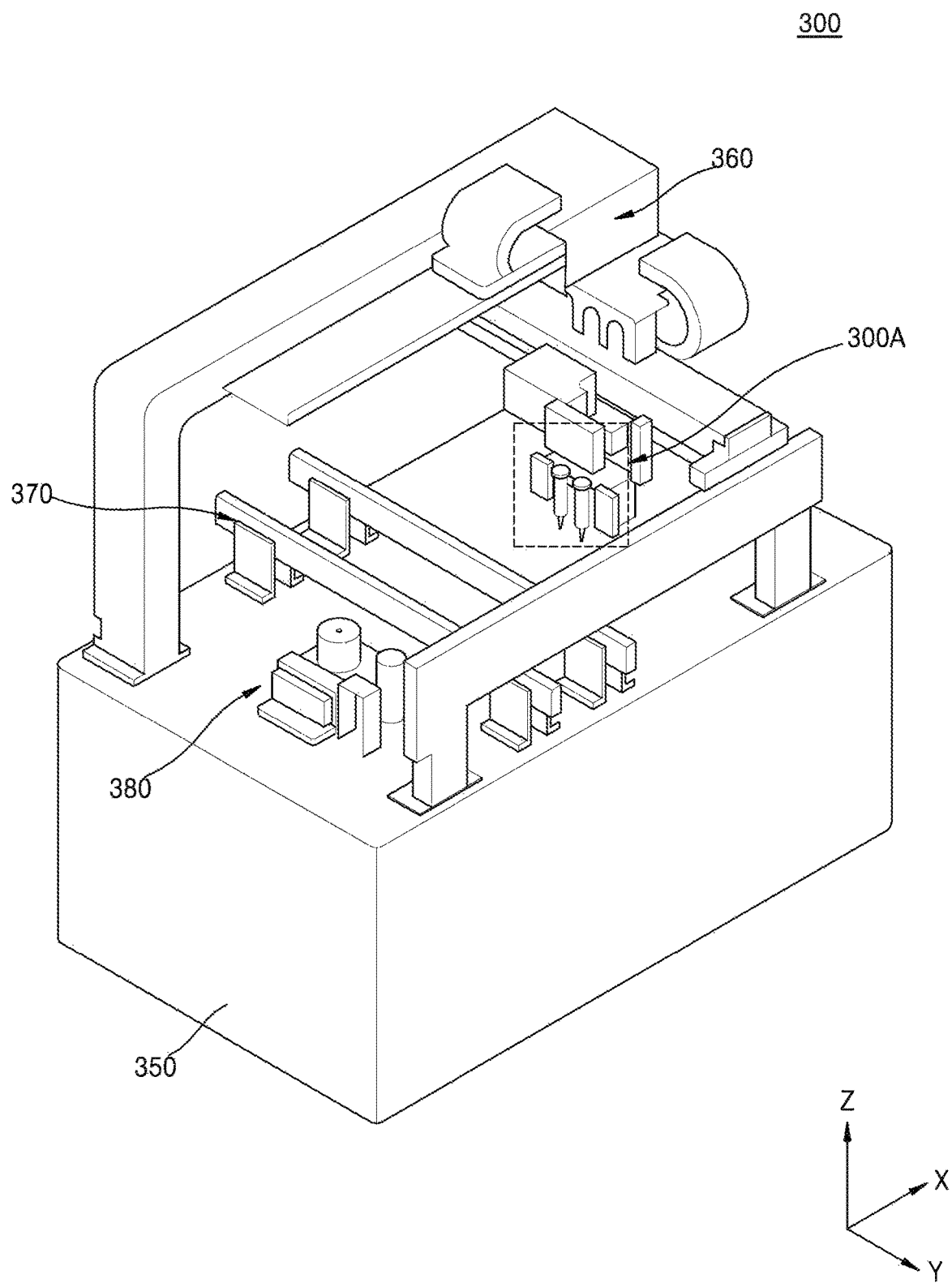
FIG. 12 is a perspective view of a three-dimensional (3D) printer for manufacturing a semiconductor package, according to an exemplary embodiment.

FIG. 12 is a schematic perspective view of a 3D printer 300 that manufactures at least one of the semiconductor packages 100 and 100a through 100h, according to an exemplary embodiment. The 3D printer 300 may form an insulating layer having a high aspect ratio by using a thixotropic material or a hot melt material in each of the semiconductor packages 100 and 100a through 100h. In the illustration of FIG. 12, components of the 3D printer 300 may be omitted or exaggerated, for convenience of explanation.

Referring to FIG. 12, the 3D printer 300 may include a dispensing head unit 300A, a frame unit 350, a head transportation unit 360, a chip transportation unit 370, and a measuring unit 380. According to an exemplary embodiment, the 3D printer 300 may further include a control unit (not shown) for controlling the dispensing head unit 300A, and the head transportation unit 360 such that the dispensing head unit 300A forms an insulating layer or a shielding layer on a semiconductor chip so that it can have a high aspect ratio.

The frame unit 350 is a fixing unit configured to fix the 3D printer 300, and the dispensing head unit 300A, the head transportation unit 360, the chip transportation unit 370, and the measuring unit 380 may be disposed on the frame unit 350.

The dispensing head unit 300A may dispense appropriate material on to a semiconductor chip in the chip transportation unit 370. The head transportation unit 360 may be connected to the dispensing head unit 300A. The head transportation unit 360 may move the dispensing head unit 300A in a first direction (a direction x), a second direction (a direction y), and a third direction (a direction z). Also, the head transportation unit 360 may rotate the dispensing head unit 300A.

The chip transportation unit 370 may move the semiconductor chip in the second direction (the direction y). The chip transportation unit 370 may move the semiconductor chip, on which the insulating layer and the shielding layer are formed by the dispensing head unit 300A, in the second direction (the direction y), and may move the semiconductor chip, on which the insulating layer and the shielding layer are not yet formed, to be adjacent to the dispensing head unit 300A.

The measuring unit 380 may measure a weight of the semiconductor chip and adjust a location of the semiconductor chip. The measuring unit 380 may include a module for cleansing the nozzles 330 and 332 of the dispensing head unit 300A.

The dispensing head unit 300A may form an insulating layer 210 (refer to FIG. 13) and a shielding layer 220 (refer to FIG. 13) on the semiconductor chip 200. The detailed descriptions will be given with reference to FIG. 13.

Figure 13:
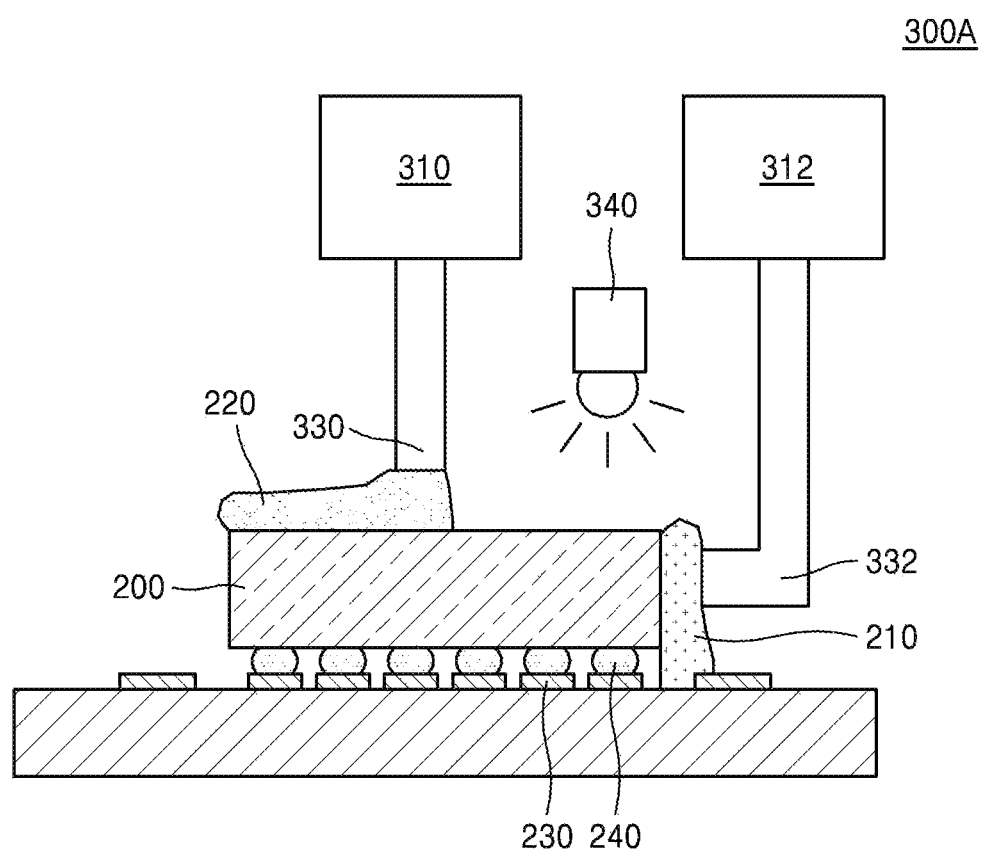
FIG. 13 is a conceptual view for describing a 3D printer for manufacturing a semiconductor package, according to an exemplary embodiment.

FIG. 13 is a view for describing a method of manufacturing at least one of the semiconductor packages 100 and 100a through 100h by using the 3D printer 300 illustrated in FIG. 12, according to an exemplary embodiment. FIG. 13 is a view of the dispensing head unit 300A illustrated in FIG. 12, which is conceptually schematized for convenience of explanation.

Referring to FIG. 13, a contact pad 230 may be connected to a contact pad 240 connected to an internal circuit of a semiconductor chip 200. According to an exemplary embodiment, the contact pad 240 may be a metal ball grid array, which is solderable. Also, the contact pad 230 may be formed by a high temperature soldering reflow with respect to a circuit pattern formed on a package substrate.

The shielding layer 220 may be formed on an upper surface of the semiconductor chip 200 by injecting shielding material into the nozzle 330 by using the pump structure 310. According to an exemplary embodiment, the shielding material may be thixotropic material or hot melt material. The shielding layer 220 may be formed by a dispensing process in which the shielding material is injected via the nozzle 330, and thus, the shielding layer 220 may have a square shape including an edge having a predetermined radius of curvature (refer to FIG. 11E).

Also, the insulating layer 210 may be formed on a side surface of the semiconductor chip 200 by injecting an insulating material into the nozzle 332 of the pump structure 312. The insulating material may be thixotropic material or hot melt material.

According to an exemplary embodiment, the shielding material and the insulating material may be heat cured or UV cured via a light source 340.

Figure 14:
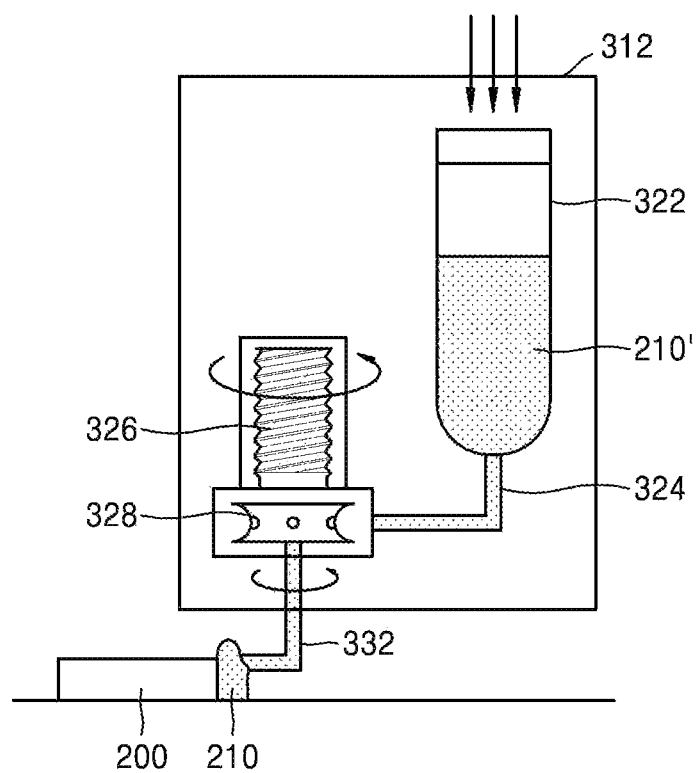
FIG. 14 is a view for describing an operating method of a 3D printer for manufacturing a semiconductor package, according to an exemplary embodiment.

FIG. 14 is a view for describing a method of manufacturing at least one of the semiconductor packages 100 and 100a through 100h by using the 3D printer 300 illustrated in FIG. 12, according to an exemplary embodiment. FIG. 14 is a cross-sectional view for describing in detail an operation of the second pump structure 312 illustrated in FIG. 13.

Referring to FIG. 14, the second pump structure 312 may include an injection unit 322, a pipe 324, an auger pump 326, a rotation ring 328, and a nozzle 332. An insulating material 210' may be loaded in the injection unit 322, and the insulating material 210' may flow into the rotation ring 328 via the pipe 324 by a pressure applied from the outside. The insulating material 210' may be thixotropic material or hot melt material.

The insulating material 210' may flow into an opening in the rotation ring 328, and may form the insulating layer 210 on the side surface of the semiconductor chip 200 via the nozzle 332. The rotation ring 328 may rotate according to a rotational force of the auger pump 326, and may discharge the insulating material in a direction of the nozzle 332 via a pressure generated due to the rotation of the auger pump 326.

According to an exemplary embodiment, shielding material may also be dispensed by a 3D printer 300. The shielding material may be formed of thixotropic material or hot melt material. This aspect will be described in detail with reference to FIGS. 15A to 16.

Figure 15A:
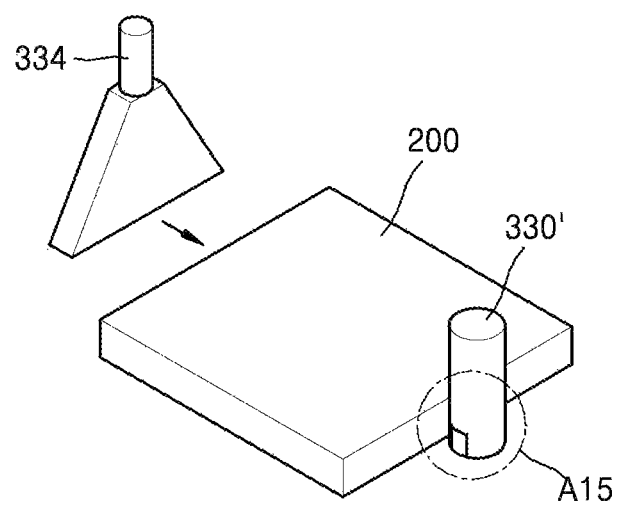
FIGS. 15A and 15B are views for describing a method of manufacturing a semiconductor package, according to an exemplary embodiment.
Figure 15B:
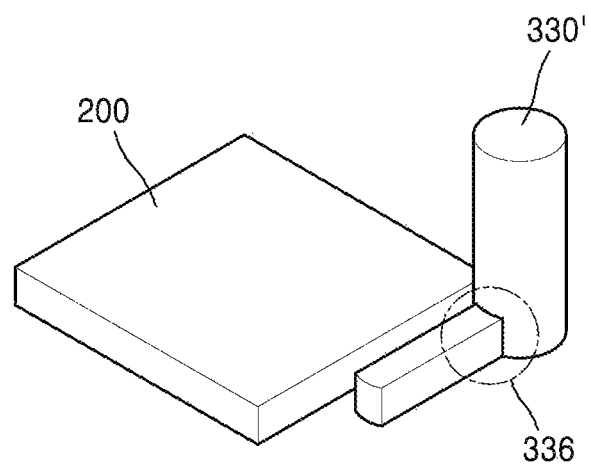

FIGS. 15A and 15B are views for describing a method of manufacturing at least one of the semiconductor packages 100 and 100a through 100h by using the 3D printer 300 illustrated in FIG. 12, according to an exemplary embodiment. The dispensing head unit 300A (refer to FIG. 12) may include a nozzle 330' and a coating dispenser 334.

Referring to FIG. 15A, an upper surface portion of the semiconductor chip 200 may be coated with thixotropic material or hot melt material via the coating dispenser 334, and a side surface portion of the semiconductor chip 200 may be coated with thixotropic material or hot melt material, by using the nozzle 330'. An edge at which the upper surface portion and the side surface portion of the semiconductor chip 200 meet each other may have a curvature. FIG. 15B is an enlarged view of portion A15 of FIG. 15A.

Referring to FIG. 15B, the side surface portion of the semiconductor chip 200 may be coated with thixotropic material or hot melt material by using the nozzle 330' with an opening 336 at its side surface.

Also, according to an exemplary embodiment, the insulating layer or the shielding layer may be formed by a material supply device including an opening 336 having the same shape as a side surface of the insulating layer or the shielding layer. For example, the opening 336 may have a slit shape. The opening 336 may have various shapes according to necessity. 3D printing may be easily performed on the side surface portion by using the opening 336 of the side surface.

Figure 16A:
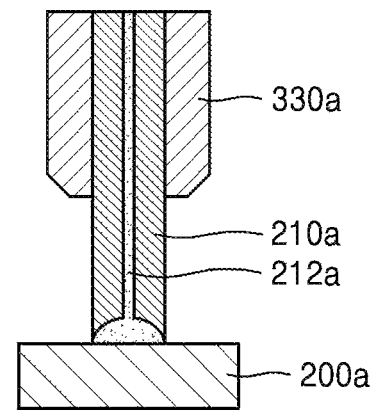
FIGS. 16A and 16B are views for describing a method of manufacturing a semiconductor package, according to an exemplary embodiment.
Figure 16B:
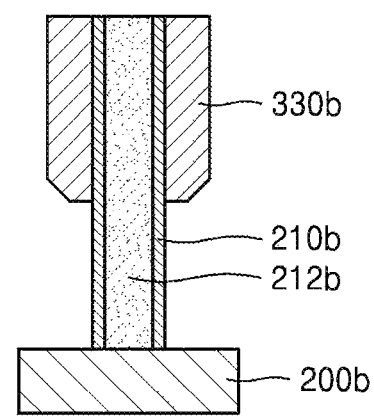

FIGS. 16A and 16B are views for describing a method of manufacturing a semiconductor package, according to an exemplary embodiment. FIGS. 16A and 16B are views of a method of forming thixotropic materials 210a, 210b, 212a, and 212b on semiconductor chips 200a and 200b by using nozzles 330a and 330b of the 3D printer 300 illustrated in FIG. 12.

Referring to FIG. 16A, the nozzle 330a may be used to dispense the thixotropic materials 210a and 212a on the semiconductor chip 200a. For example, the thixotropic material 210a may have low viscosity via a high shear stress, and the thixotropic material 212a may have high viscosity via a low shear stress.

Referring to FIG. 16B, the nozzle 330b may be used to dispense the thixotropic materials 210b and 212b on the semiconductor chip 200b. For example, the thixotropic material 210b may have low viscosity via a high shear stress, and the thixotropic material 212b may have a high viscosity via a low shear stress.

The thixotropic materials 210a, 210b, 212a, and 212b may be formed as layers as illustrated in FIGS. 16A and 16B. Also, the case of FIG. 16B may realize a higher thixotropic property than the case of FIG. 16A. Thus, the case of FIG. 16B may realize a higher aspect ratio than the case of FIG. 16B, due to the higher thixotropic property.

Figure 17:
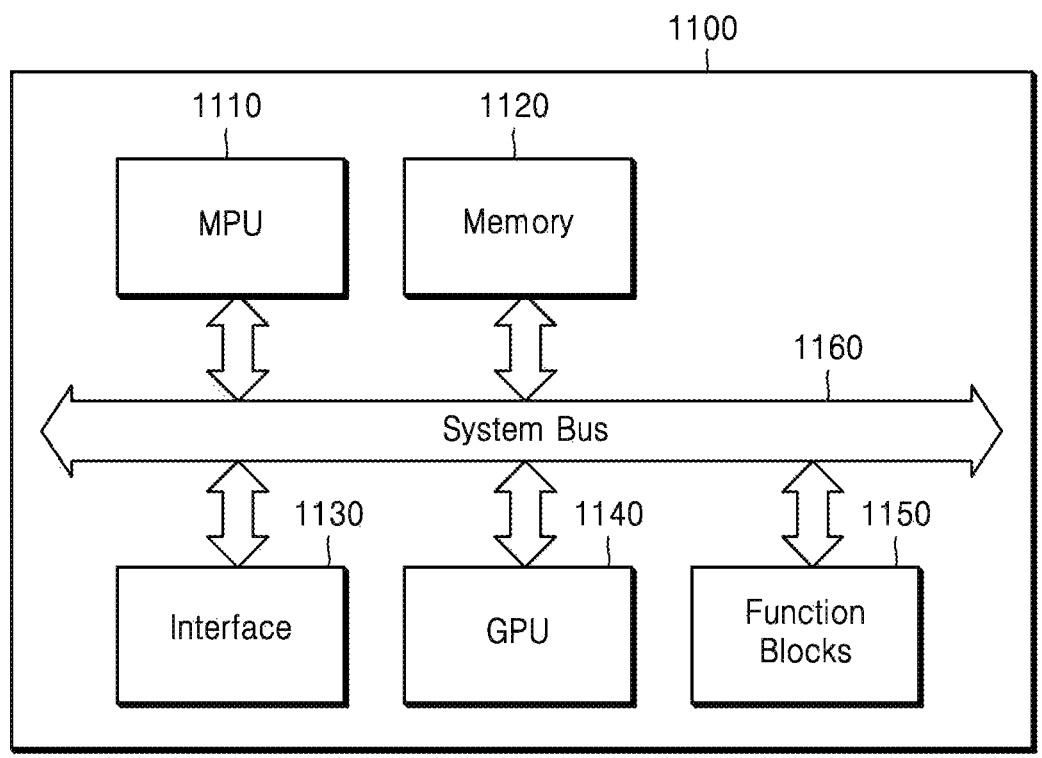
FIG. 17 is a schematic view of a structure of a semiconductor package according to an exemplary embodiment.

FIG. 17 is a schematic view of a structure of a semiconductor package 1100 according to an exemplary embodiment.

Referring to FIG. 17, the semiconductor package 1100 may include a micro-processing unit 1110, memory module 1120, an interface 1130, a graphic-processing unit 1140, function blocks 1150, and a bus 1160 connecting the micro-processing unit 1110, the memory module 1120, the interface 1130, the graphic-processing unit 1140, and the function blocks 1150. The semiconductor package 1100 may include both the micro-processing unit 1110 and the graphics-processing unit 1140, or the semiconductor package 1100 may include only one of the micro-processing unit 1110 and the graphics-processing unit 1140.

The micro-processing unit 1110 may include a core processor and a level-2 (L2) cache. For example, the micro-processing unit 1110 may include a multiple processing units. Each of the multiple processing units may have the same or different performance. Also, the multiple processing units may be simultaneously active or may be active at different times. The memory module 1120 may comprise one or more memory chips and may store, for example, a process result of the function blocks 1150 under a control of the micro-processing unit 1110. The interface 1130 may allow the semiconductor package 1100 to interface with external devices. For example, the interface 1130 may interface with a camera, a liquid crystal display (LCD), a speaker, etc.

The graphics-processing unit 1140 may perform graphic functions such as, for example, video encoding and decoding or 3D graphics.

The function blocks 1150 may perform various functions. For example, when the semiconductor package 1100 is an AP used in a mobile device, some of the function blocks 1150 may perform communication functions.

The semiconductor package 1100 may be at least one of the semiconductor packages 100 and 100a through 100h described with reference to FIGS. 1 through 10. The micro-processing unit 1110 and/or the graphics-processing unit 1140 may be at least one of the semiconductor chips 130 and 130a through 130h illustrated with reference to FIGS. 1 through 10. The memory module 1120 may be at least one of the semiconductor chips 130 and 130a through 130h illustrated with reference to FIGS. 1 through 10.

The interface 1130 and the function blocks 1150 may correspond to some of the semiconductor chips 130 and 130a through 130h illustrated with reference to FIGS. 1 through 10.

The semiconductor package 1100 may include the micro-processing unit 1110 and/or the graphics-processing unit 1140, together with the memory module 1120. Also, since the semiconductor package 1100 may rapidly discharge EMI generated in the micro-processing unit 1110 and/or the graphics-processing unit 1140 to the outside of the semiconductor package 1100, a partial heat concentration phenomenon which may occur in the semiconductor package 1100 may be prevented. Thus, the operational reliability of the semiconductor package 1100 may be improved and the semiconductor package 1100 may have higher capacity, higher performance, and higher reliability.

Figure 18:
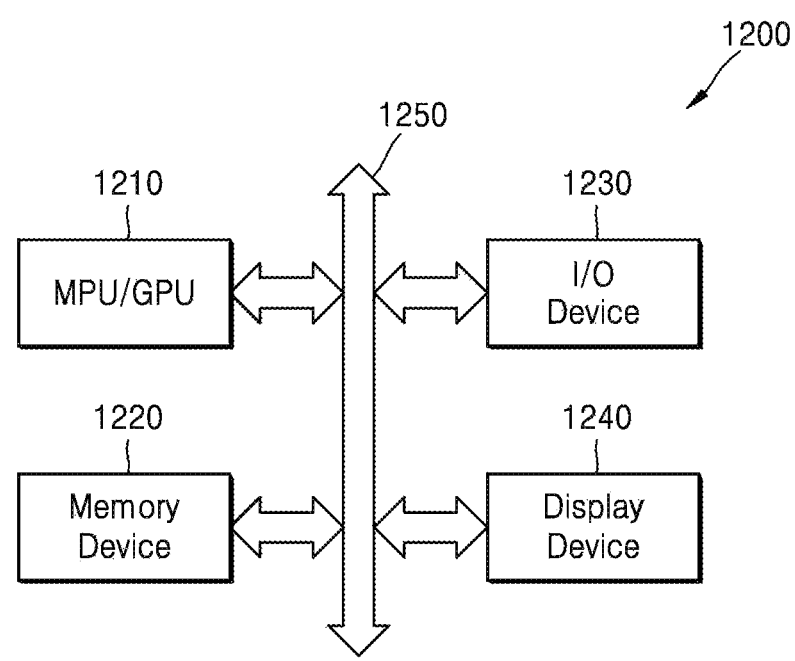
FIG. 18 is a view of an electronic system including a semiconductor package, according to an exemplary embodiment.

FIG. 18 is a view of an electronic system 1200 including a semiconductor package, according to an exemplary embodiment.

Referring to FIG. 18, a micro-processing unit (MPU)/graphics-processing unit (GPU) 1210 may be mounted in the electronic system 1200. The electronic system 1200 may be, for example, a mobile device, a desk top computer, or a server. Also, the electronic system 1200 may further include a memory device 1220, an input/output device 1230, and a display device 1240, which may be electrically connected to a bus 1250. The MPU/GPU 1210 and the memory device 1220 may be at least one of the semiconductor packages 100 and 100a through 100h described with reference to FIGS. 1 through 10.

Figure 19:
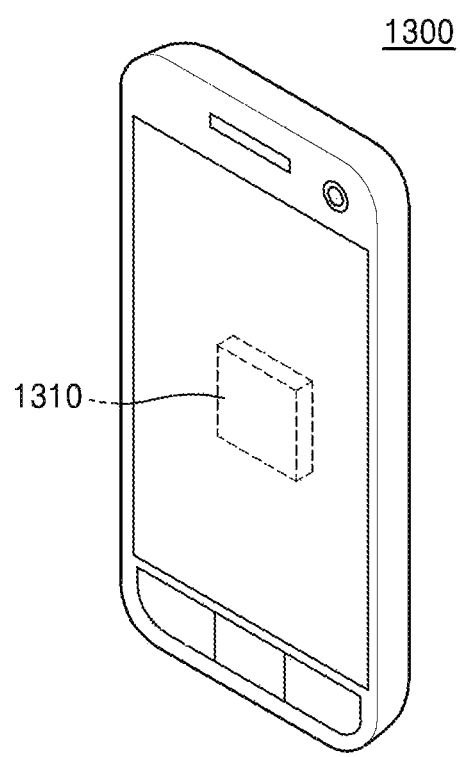
FIG. 19 is a schematic perspective view of an electronic device, to which a semiconductor package is applied, according to an exemplary embodiment.

FIG. 19 is a schematic perspective view of an electronic device including a semiconductor package 1310.

FIG. 19 illustrates an example in which the electronic system 1200 is applied to a mobile phone 1300. According to an exemplary embodiment, the mobile phone 1300 may be a smartphone including a function of installing and executing an application. The mobile phone 1300 may include a communication module for receiving installation data of an application, a memory module for storing the installation data of the application, and an application processor (AP) for installing the application based on the installation data of the application and executing the installed application. The AP may include an MPU or a GPU. The application processor and/or the memory may include the semiconductor package 1310. The semiconductor package 1310 may be at least one of the semiconductor packages 100 and 100a through 100a described with reference to FIGS. 1 through 10.

The mobile phone 1300 may include the semiconductor package 1310, which includes a high performance application processor and a high capacity memory device, while having a high reliability, and thus, the mobile phone 1300 may be miniaturized and may have high performance.

In addition, the electronic system 1200 may be applied to portable laptop computers, MP3 players, navigation devices, solid state disks (SSD), automobiles, or household appliances.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:
1. A semiconductor package comprising:
   a semiconductor chip mounted on a substrate;
   an insulating layer covering at least portions of an upper surface and a side surface of the semiconductor chip and comprising an edge where an upper surface portion of the insulating layer and a side surface portion of the insulating layer meet to form an angle of 90°; and
a shielding layer covering at least a portion of the insulating layer,
wherein a thickness of a side surface portion of the shielding layer is less than a height of the side surface portion of the shielding layer; and
wherein the shielding layer comprises an edge whereon an upper surface of the shielding layer and a side surface of the shielding layer contact each other, and
wherein the edge has a radius of curvature less than a sum of a thickness of the upper surface of the shielding layer and a thickness of the side surface of the shielding layer, and a maximum value of the radius of curvature is the same as or less than a thickness of the shielding layer.

2. The semiconductor package of claim 1, wherein the semiconductor package comprises a multi-chip package.

3. The semiconductor package of claim 1, wherein the thickness of the side surface portion of the shielding layer is less than one fifth of a height of the shielding layer.

4. The semiconductor package of claim 1, wherein an upper surface of the shielding layer forms an angle of substantially 90° with a side surface of the shielding layer.

5. The semiconductor package of claim 1, the insulating layer comprising a thixotropic material or a hot melt material.

6. The semiconductor package of claim 5, wherein the thixotropic material comprises at least one of composite fine silica, bentonite, fine particles of surface treated calcium carbonate, hydrogenated castor oil, metal soap, aluminum stearate, polyamide wax, oxidized polyethylene, and linseed polymerized oil.

7. The semiconductor package of claim 5, wherein the hot melt material comprises at least one of polyurethane, polyurea, polyvinyl chloride, polystyrene, acrylonitrile butadiene styrene, polyamide, acrylic, and polybutylene terephthalate.

8. The semiconductor package of claim 5, wherein the thixotropic material or the hot melt material is cured by ultraviolet curing or heat curing.

9. The semiconductor package of claim 5, wherein the shielding layer comprises a metallic material.

10. The semiconductor package of claim 1, wherein at least one of the shielding layer and the insulating layer is formed by three-dimensional printing.

11. The semiconductor package of claim 1, wherein the semiconductor package comprises an application processor for use in a mobile phone.

12. A semiconductor package comprising:
a semiconductor chip mounted on a substrate;
an insulating layer covering at least a portion of the semiconductor chip and comprising a thixotropic material or a hot melt material, the insulating layer covering at least portions of an upper surface and a side surface of the semiconductor chip and comprising an edge where an upper surface portion of the insulating layer and a side surface portion of the insulating layer meet to form an angle of 90°; and
a shielding layer covering the semiconductor chip and the insulating layer;
wherein a sum of a thickness of the insulating layer and a thickness of the shielding layer is less than one fifth of a height of the shielding layer, and
wherein the shielding layer comprises an edge whereon an upper surface of the shielding layer and a side surface of the shielding layer contact each other, and
wherein the edge has a radius of curvature less than a sum of a thickness of the upper surface of the shielding layer and a thickness of the side surface of the shielding layer, and a maximum value of the radius of curvature is the same as or less than a thickness of the shielding layer.

13. The semiconductor package of claim 12, wherein the thixotropic material comprises at least one of composite fine silica, bentonite, fine particles of surface treated calcium carbonate, hydrogenated castor oil, metal soap, aluminum stearate, polyamide wax, oxidized polyethylene, and linseed polymerized oil.

14. The semiconductor package of claim 12, wherein the hot melt material comprises at least one of polyurethane, polyurea, polyvinyl chloride, polystyrene, acrylonitrile butadiene styrene, polyamide, acrylic, and polybutylene terephthalate.

15. The semiconductor package of claim 12, wherein the thixotropic material or the hot melt material is cured by ultraviolet curing or heat curing.

16. The semiconductor package of claim 12, wherein the shielding layer comprises a metallic material.

17. The semiconductor package of claim 12, wherein a sum of a thickness of the insulating layer and a thickness of the shielding layer is less than a height of the shielding layer.

18. The semiconductor package of claim 12, wherein the semiconductor package comprises at least one of an application processor, a display driver integrated circuit, a timing controller, and a power module integrated circuit.

19. The semiconductor package of claim 12, wherein at least one of the insulating layer and the shielding layer is formed by three-dimensional printing.

20. The semiconductor package of claim 12, wherein at least one of the insulating layer and the shielding layer is formed by a material supply device comprising an opening having same shape as a side surface shape of a corresponding one of the insulating layer and the shielding layer.

21. The semiconductor package of claim 12, wherein the insulating layer covers at least a portion of the semiconductor chip.

22. The semiconductor package of claim 12, wherein the semiconductor chip comprises:
a first semiconductor chip and a second semiconductor chip;
the first semiconductor chip and the second semiconductor chip are aligned on the substrate; and
the insulating layer is interposed between the first semiconductor chip and the second semiconductor chip.

23. A semiconductor package comprising:
a printed circuit board;
a first semiconductor package formed on the printed circuit board and comprising a first package substrate connected to the printed circuit board via a first connection terminal and a first semiconductor chip mounted on the first package substrate;
a second semiconductor package formed on the first package substrate and comprising a second package substrate connected to the first package substrate via a second connection terminal and a plurality of second semiconductor chips stacked on the second package substrate as a multi-layer structure;
an insulating layer covering at least a portion of a side surface of the first semiconductor package and a side surface of the second semiconductor package and comprising a thixotropic material or a hot melt material; and a shielding layer covering at least a portion of the side surface of the first semiconductor package and an upper surface and the side surface of the second semiconductor package, wherein a thickness of a side surface portion of the shielding layer is less than a height of the shielding layer;

wherein the shielding layer comprises an edge whereon an upper surface of the shielding layer and a side surface of the shielding layer contact each other, wherein the edge has a radius of curvature less than a sum of a thickness of the upper surface of the shielding layer and a thickness of the side surface of the shielding layer, and a maximum value of the radius of curvature is the same as or less than a thickness of the shielding layer, and wherein the insulating layer comprises an edge where an upper surface portion of the insulating layer and a side surface portion of the insulating layer meet to form an angle of 90°.

24. The semiconductor package of claim 23, further comprising wires connecting the plurality of second semiconductor chips to the second package substrate, wherein the wires are configured to transmit electric signals between the plurality of second semiconductor chips and the second package substrate.

* * * * *